(12) United States Patent
Nishikawa et al.

(10) Patent No.: US 10,516,025 B1
(45) Date of Patent: Dec. 24, 2019

(54) THREE-DIMENSIONAL NAND MEMORY CONTAINING DUAL PROTRUSION CHARGE TRAPPING REGIONS AND METHODS OF MANUFACTURING THE SAME

(71) Applicant: SANDISK TECHNOLOGIES LLC, Addison, TX (US)

(72) Inventors: Masatoshi Nishikawa, Yokkaichi (JP); Hisakazu Otoi, Yokkaichi (JP); Akio Nishida, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/009,661

(22) Filed: Jun. 15, 2018

(51) Int. Cl.
  *H01L 29/00* (2006.01)
  *H01L 29/423* (2006.01)
  *H01L 29/66* (2006.01)
  *H01L 27/11556* (2017.01)

(52) U.S. Cl.
  CPC .. *H01L 29/42336* (2013.01); *H01L 27/11556* (2013.01); *H01L 29/66825* (2013.01)

(58) Field of Classification Search
  CPC combination set(s) only.
  See application file for complete search history.

(56) References Cited

U.S. PATENT DOCUMENTS

| | | | |
|---|---|---|---|
| 8,349,681 B2 | 1/2013 | Alsmeier et al. | |
| 8,658,499 B2 | 2/2014 | Makala et al. | |
| 9,136,130 B1 | 9/2015 | Wada et al. | |
| 9,252,151 B2 | 2/2016 | Chien et al. | |
| 9,356,031 B2 | 5/2016 | Lee et al. | |
| 9,397,093 B2 | 7/2016 | Makala et al. | |
| 9,419,012 B1 | 8/2016 | Shimabukuro et al. | |
| 9,576,975 B2 | 2/2017 | Zhang et al. | |
| 9,711,530 B1 | 7/2017 | Ikawa et al. | |
| 9,812,463 B2 | 11/2017 | Sharangpani et al. | |
| 9,875,929 B1 | 1/2018 | Shukla et al. | |
| 9,960,180 B1 | 5/2018 | Zhou et al. | |
| 9,985,049 B1 * | 5/2018 | Sandhu | H01L 27/11582 |
| 9,991,277 B1 | 6/2018 | Tsutsumi et al. | |
| 2017/0243879 A1 | 8/2017 | Yu et al. | |
| 2017/0278859 A1 | 9/2017 | Sharangpani et al. | |

OTHER PUBLICATIONS

Endoh et al., "Novel Ultra High Density Memory with a Stacked-Surrounding Gate Transistor (S-SGT) Structured Cell," IEDM Proc. (2001) 33-36.

* cited by examiner

*Primary Examiner* — Fernando L Toledo
*Assistant Examiner* — Valerie N Newton
(74) *Attorney, Agent, or Firm* — The Marbury Law Group, PLLC

(57) ABSTRACT

A three-dimensional memory device includes an alternating stack of insulating layers and electrically conductive layers located over a substrate, and a memory stack structure extending through the alternating stack. The memory stack structure includes a tunneling dielectric layer, a vertical semiconductor channel, and a vertical stack of charge storage structures. Each of the charge storage structures includes an annular silicon nitride portion, a lower silicon nitride portion underlying the upper silicon nitride portion, and a spacer located between the upper silicon nitride portion and the lower silicon nitride portion. The upper and lower silicon nitride portions may be charge storage regions, while the spacer may be a floating gate or a dielectric spacer.

7 Claims, 39 Drawing Sheets

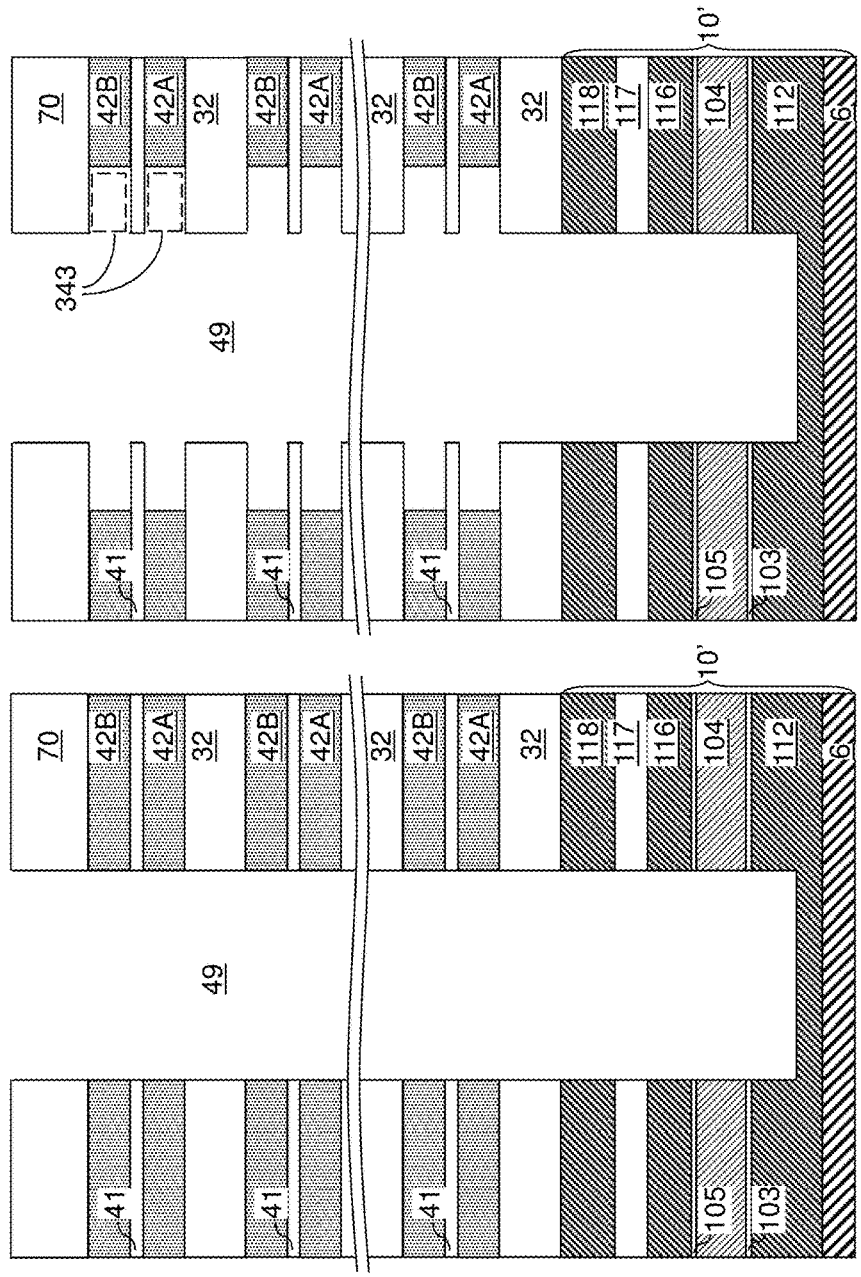

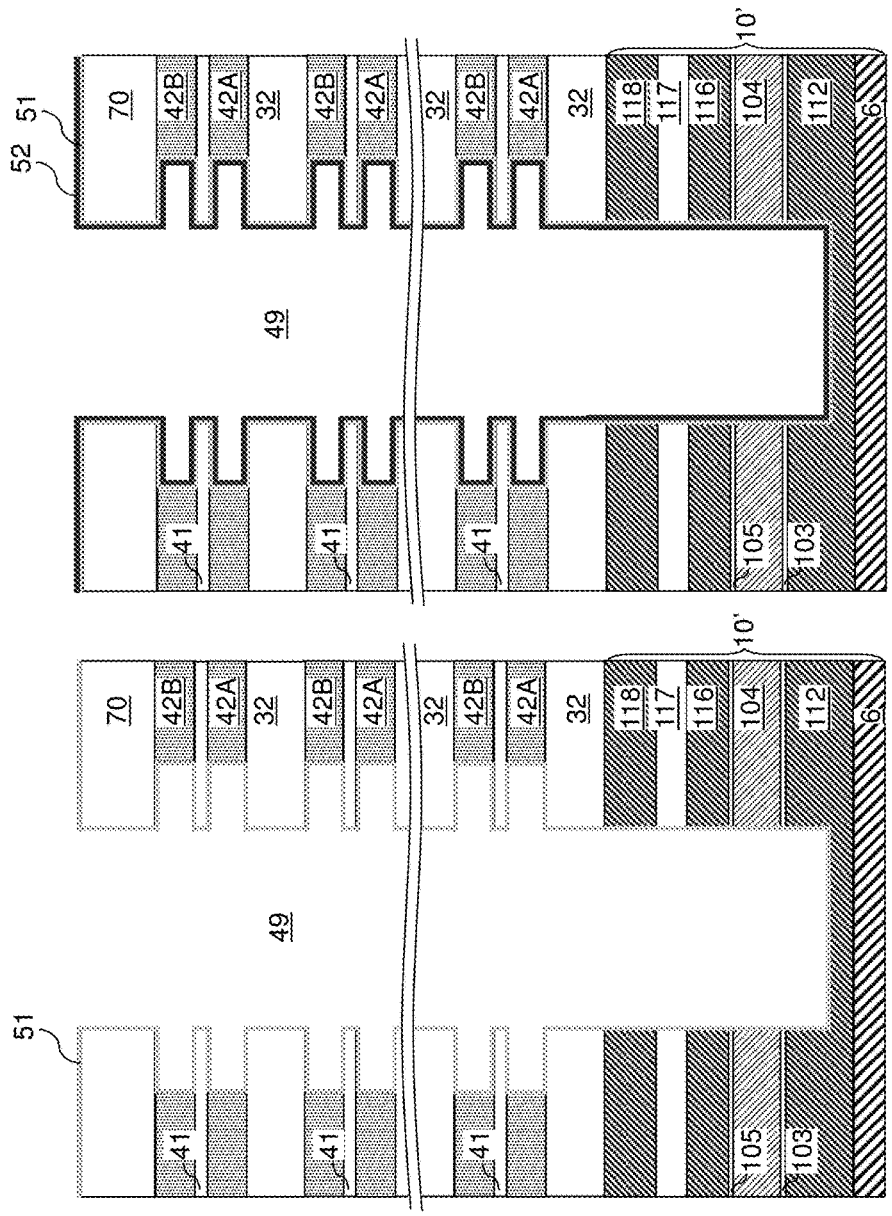

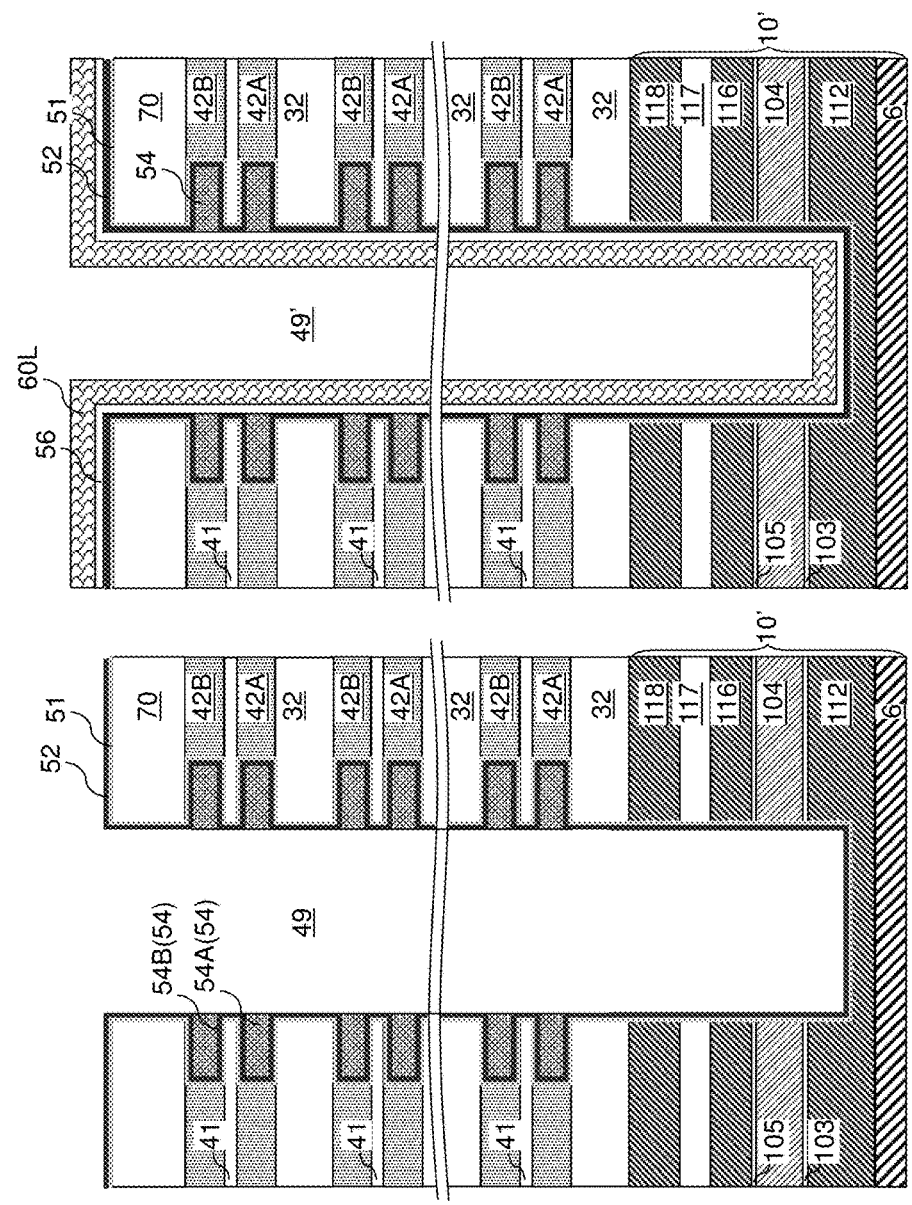

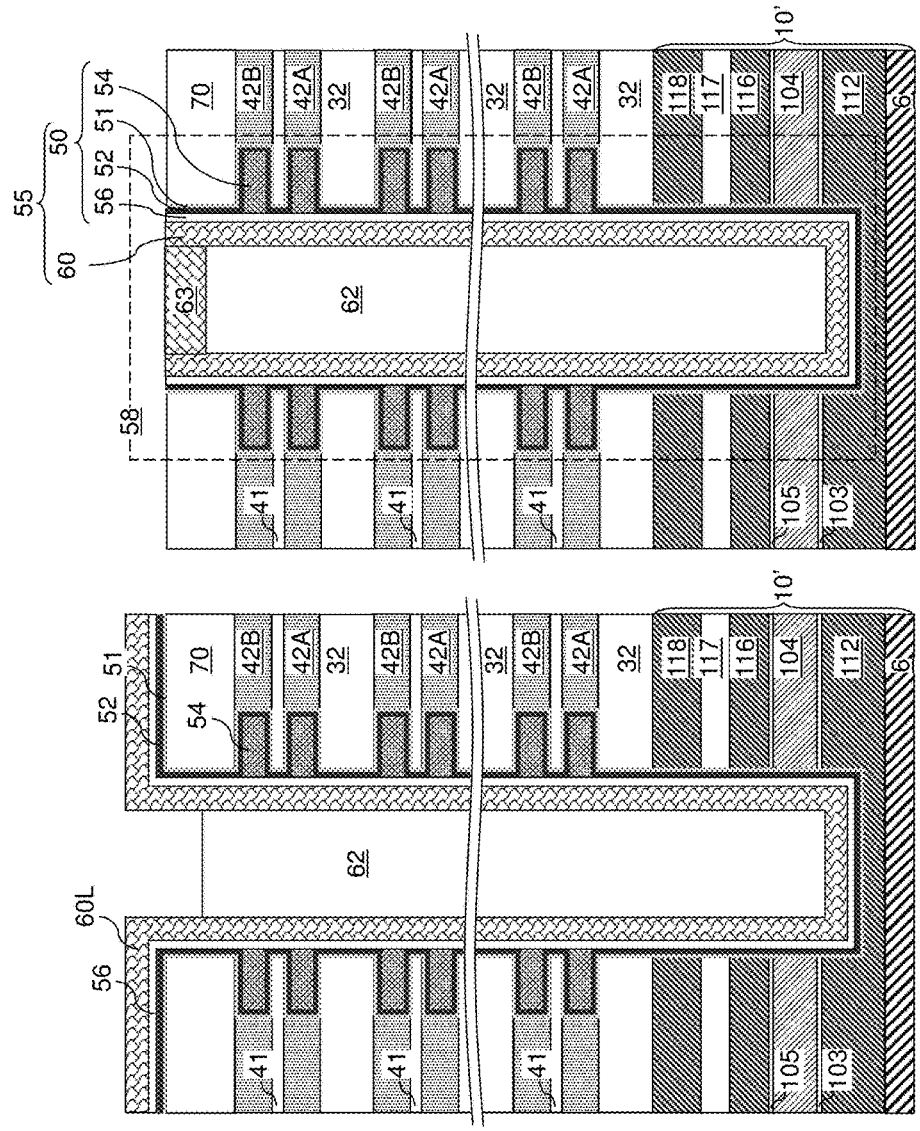

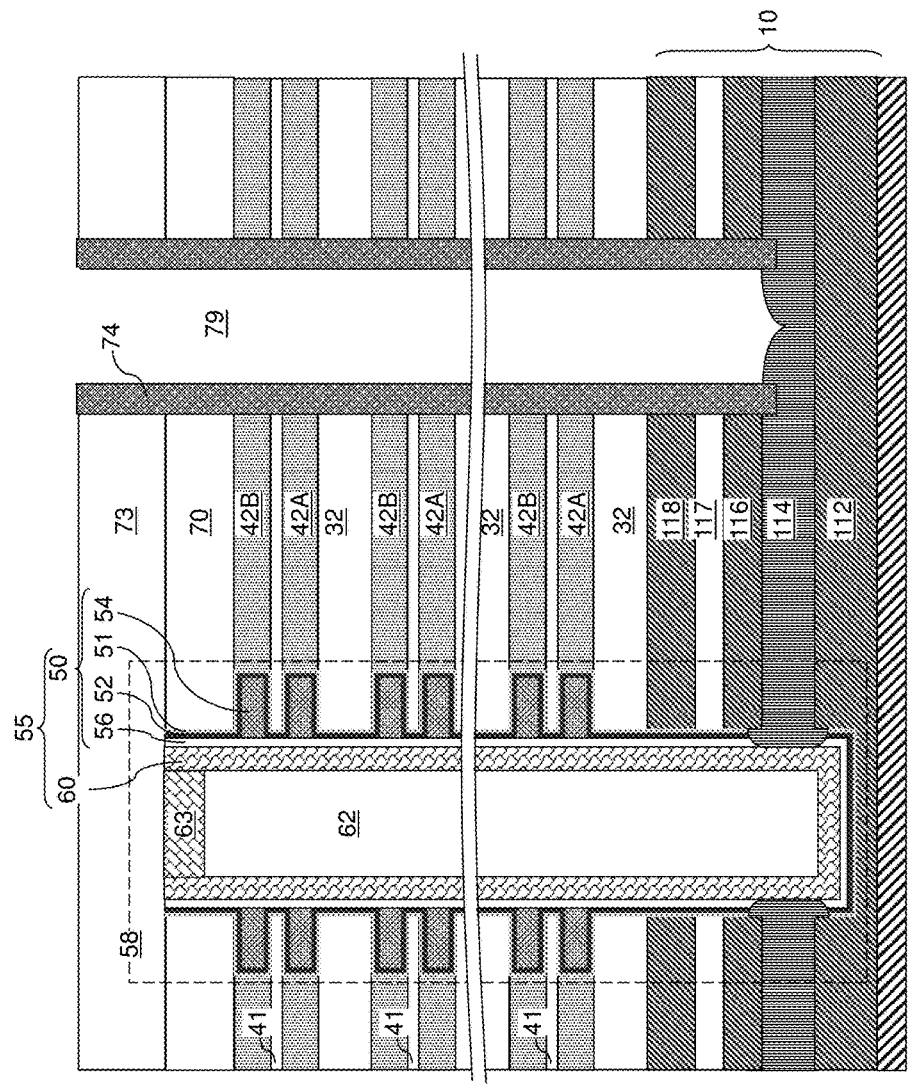

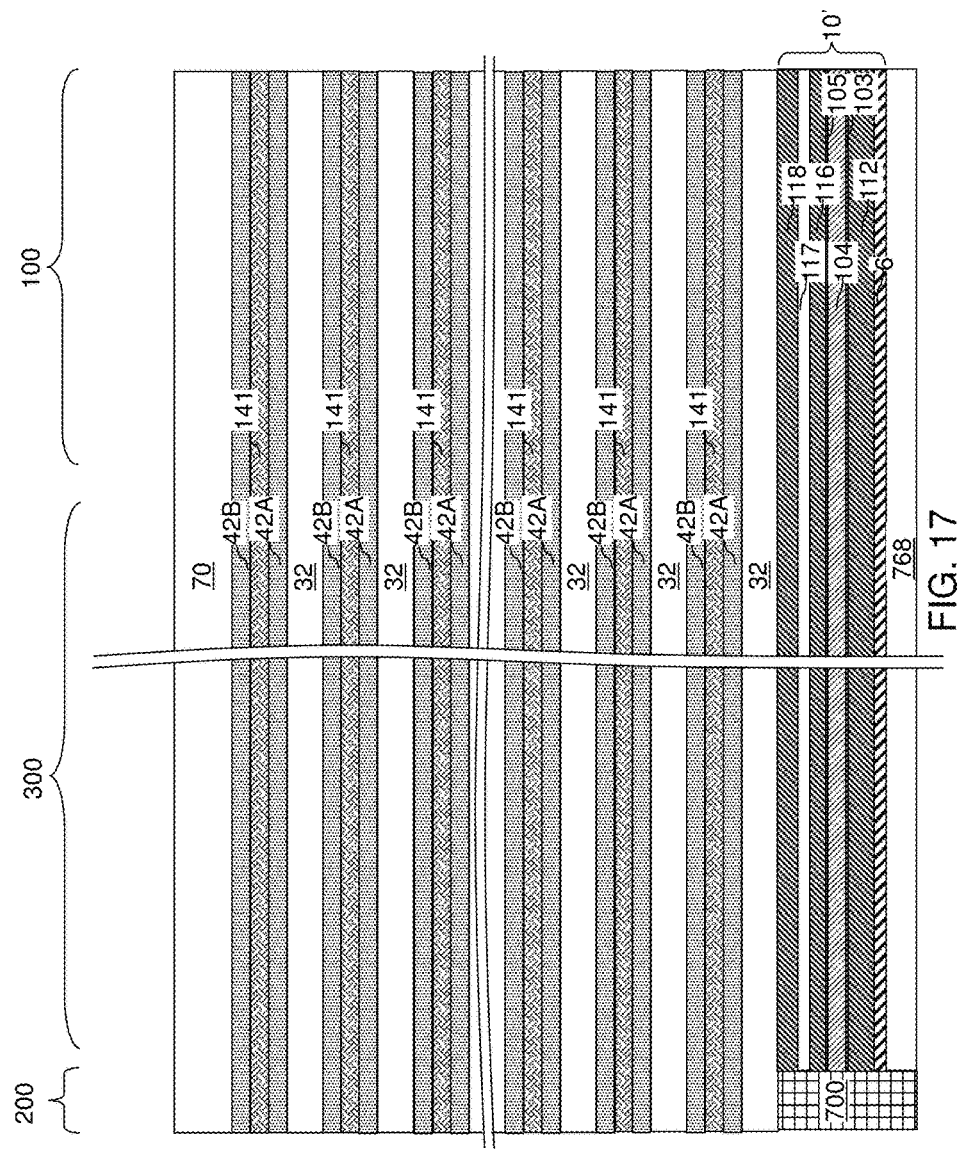

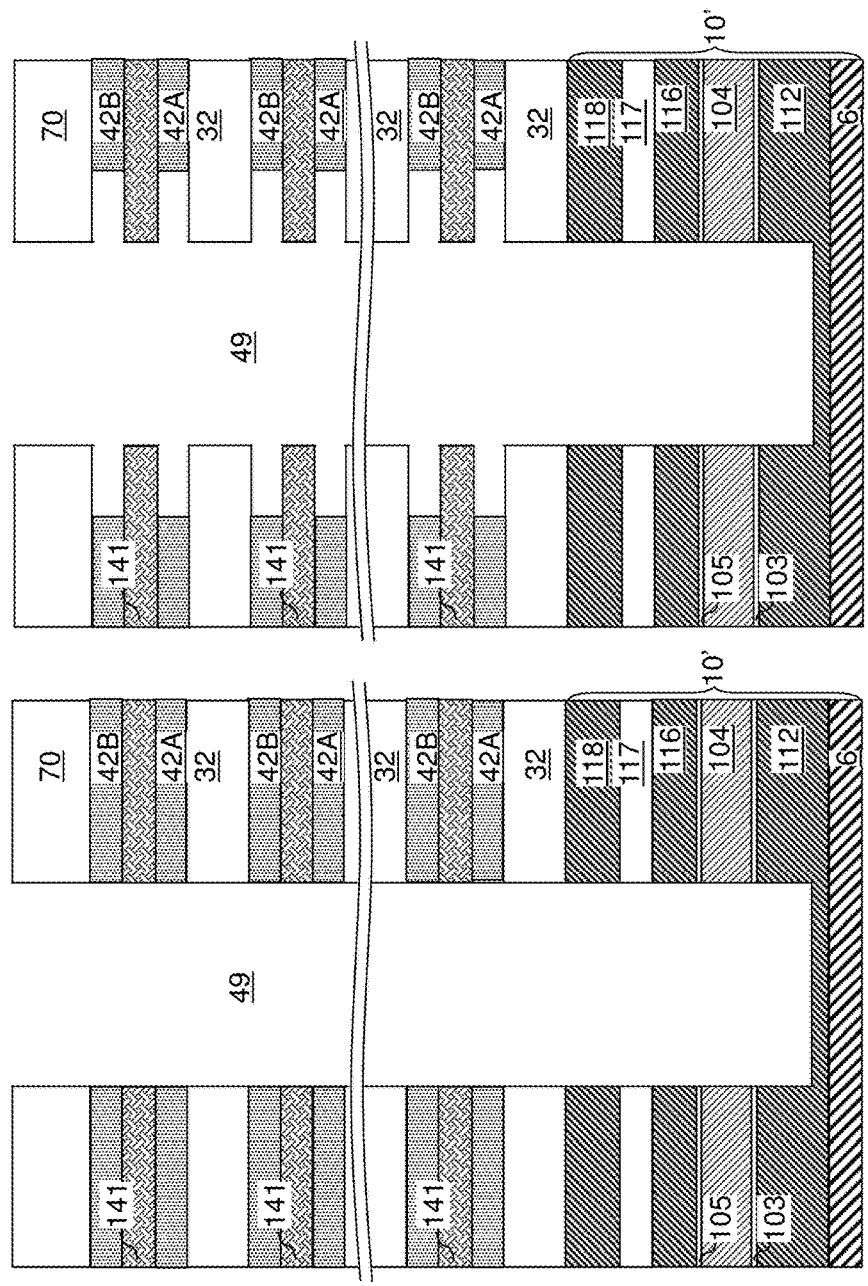

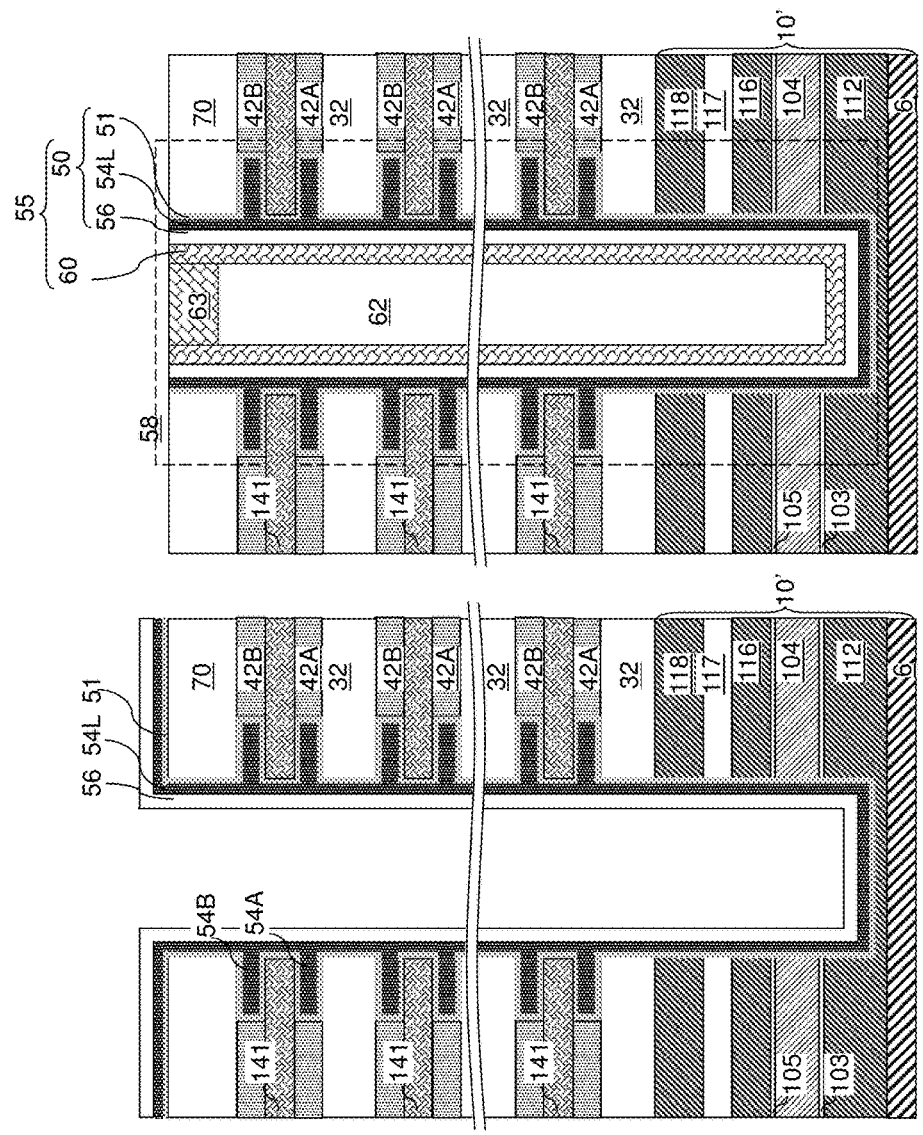

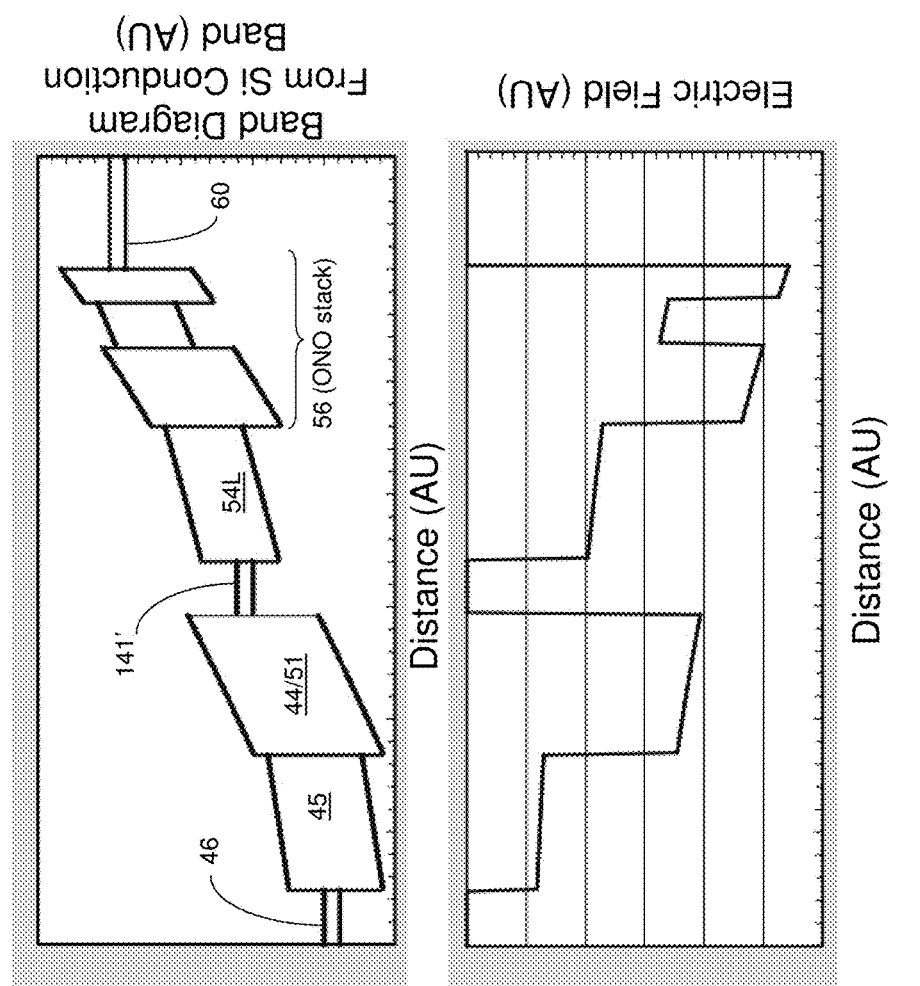

US 10,516,025 B1

THREE-DIMENSIONAL NAND MEMORY CONTAINING DUAL PROTRUSION CHARGE TRAPPING REGIONS AND METHODS OF MANUFACTURING THE SAME

FIELD

The present disclosure relates generally to the field of semiconductor devices, and particular to a three-dimensional memory device employing dual protrusion charge trapping regions and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises an alternating stack of insulating layers and electrically conductive layers located over a substrate and a memory stack structure extending through the alternating stack, wherein the memory stack structure comprises a tunneling dielectric layer a vertical semiconductor channel contacting an inner sidewall of the tunneling dielectric layer, and a vertical stack of charge storage structures located in a recess adjacent to a respective the electrically conductive layer. Each of the charge storage structures comprises an upper silicon nitride portion located adjacent to an upper portion of the respective electrically conductive layer, a lower silicon nitride portion located adjacent to a lower portion of the respective electrically conductive layer, the lower silicon nitride portion underlying the upper silicon nitride portion, and a spacer located between the upper silicon nitride portion and the lower silicon nitride portion.

According to another aspect of the present disclosure, a method of forming a three-dimensional memory device is provided, which comprises: forming a vertical layer stack including multiple repetitions of a unit layer stack including a lower sacrificial material layer, a spacer material layer, an upper sacrificial material layer, and an insulating layer over a substrate; forming a memory opening through the vertical layer stack; forming annular recesses around the memory opening at each level of the lower sacrificial material layers and the upper sacrificial material layers; forming annular silicon nitride portions in the annular recesses, wherein the annular silicon nitride portions comprise upper annular silicon nitride portions formed at levels of the upper sacrificial material layers and lower annular silicon nitride portions formed at levels of the lower sacrificial material layers; forming a tunneling dielectric layer and a vertical semiconductor channel in the memory opening and on the upper and lower annular silicon nitride portions; replacing a combination of an upper sacrificial material layer, a lower sacrificial material layer, and an intervening portion of a spacer material layer between the upper and lower sacrificial material layers within each unit layer stack with a respective replacement material portion that includes a respective electrically conductive layer, wherein a remaining portion of each spacer material layer constitutes an annular spacer that laterally surrounds the tunneling dielectric layer and is located between a respective pair of an upper annular silicon nitride portion and a lower annular silicon nitride portion.

BRIEF DESCRIPTION OF THE DRAWINGS

FIGS. 5A-5H are sequential schematic vertical cross-sectional views of a memory opening within the first exemplary structure during formation of a memory stack structure, an optional dielectric core, and a drain region therein according to the first embodiment of the present disclosure.

FIGS. 8A-8E are sequential vertical cross-sectional views of a region of the first exemplary structure during replacement of the in-process source level layers with source level layers according to the first embodiment of the present disclosure.

FIG. 17 is a schematic vertical cross-sectional view of a second exemplary structure after formation of a vertical layer stack including multiple repetitions of a unit layer stack including a lower sacrificial material layer, a spacer material layer, an upper sacrificial material layer, and an insulating layer according to the second embodiment of the present disclosure.

FIGS. 18A-18D are sequential schematic vertical cross-sectional views of a memory opening within the second exemplary structure during formation of a memory stack structure, an optional dielectric core, and a drain region therein according to the second embodiment of the present disclosure.

FIG. 25A illustrates a band diagram and electrical field strength during application of a programming bias for a memory cell according to the second embodiment of the present disclosure.

DETAILED DESCRIPTION

Figure 1:
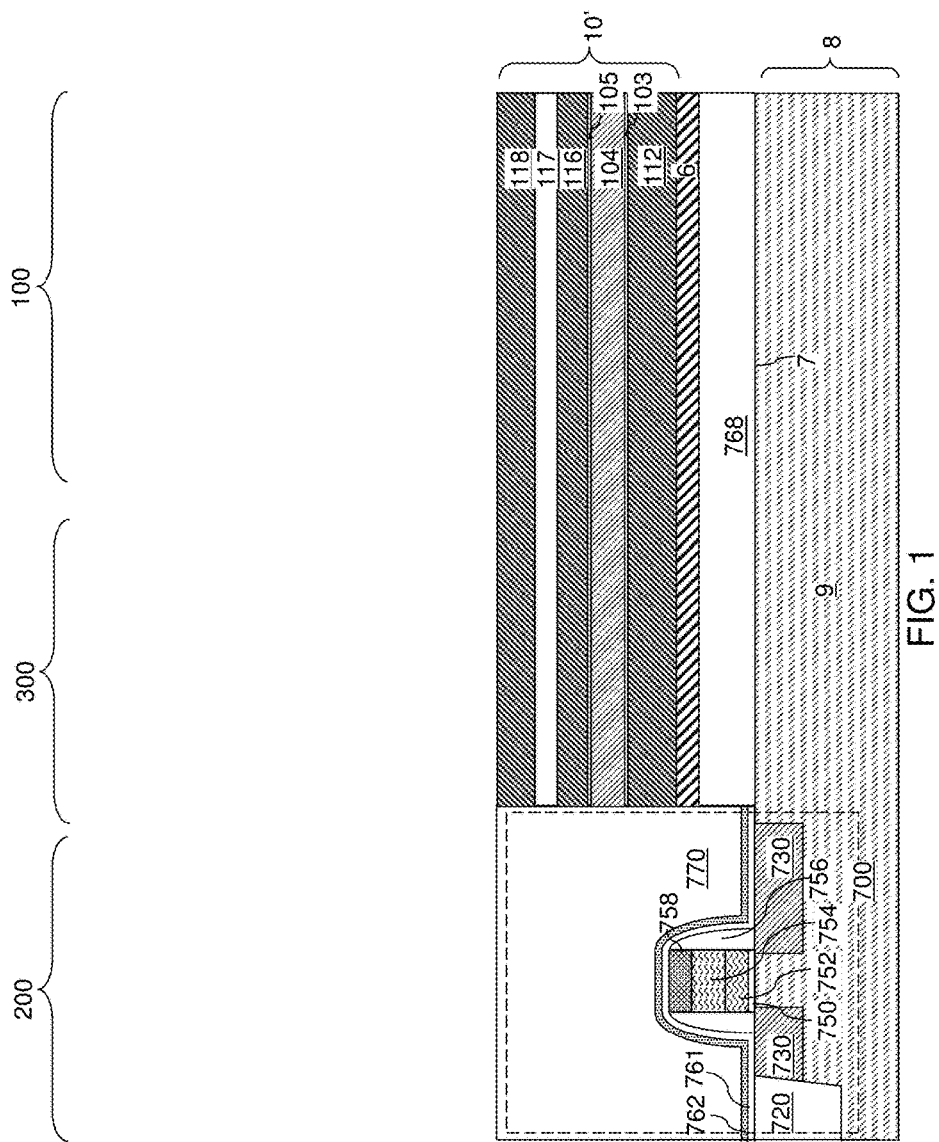
FIG. 1 is a schematic vertical cross-sectional view of a first exemplary structure after formation of at least one peripheral device, an insulating spacer layer, and an optional planar metal layer, and in-process source level layers according to a first embodiment of the present disclosure.

As the dimensions of memory cells shrink with scaling of devices, memory cell disturb during operations on adjacent memory cells increases through the increased effect of fringe fields. The memory cell disturb increases neighboring word line interference and retention loss. According to an embodiment of the present disclosure, three-dimensional memory device structures containing dual protrusion charge trapping regions enhance the programming slope and data retention. As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein. As used herein, a surface is "physically exposed" if the surface is in physical contact with vacuum, or a gas phase material (such as air).

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to a first embodiment of the present disclosure is illustrated, which can be employed, for example, to fabricate a device structure containing vertical NAND memory devices. The first exemplary structure includes a substrate 8, such as a silicon wafer or a silicon on insulator substrate, for example. The substrate 8 can include a substrate semiconductor layer 9 in an upper portion thereof. The substrate semiconductor layer 9 may be an upper portion of the silicon wafer 8, a doped well in the upper portion of the silicon wafer 8, or a semiconductor (e.g., silicon) layer located over a top surface of the substrate. The substrate 8 can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline silicon surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device. A dielectric material such as silicon oxide can be deposited over the at least one semiconductor device, and can be subsequently planarized to form a planarization dielectric layer 770. The region including the at least one semiconductor device 700 is herein referred to as a peripheral device region 200.

A dielectric material layer 768 can be formed over the semiconductor substrate layer 9. The dielectric material layer 768 may include a single dielectric material layer or a plurality of dielectric material layers. The dielectric material layer 768 may include any one or more of doped silicate glass, undoped silicate glass, and organosilicate glass. In one embodiment, the at least one dielectric material layer 768 can comprise, or consist essentially of, dielectric material layers having dielectric constant that does not exceed the dielectric constant of undoped silicate glass (silicon oxide) of 3.9.

An optional layer of a metallic material and a layer of a semiconductor material can be deposited over, or within patterned recesses of, the dielectric material layer 768, and are lithographically patterned to provide an optional conductive plate layer 6 and in-process source-level material layers 10'. The optional conductive plate layer 6, if present, provides a high conductivity conduction path for electrical current that flows into, or out of, the in-process source-level material layers 10'. The optional conductive plate layer 6 includes a conductive material such as a metal, metal silicide, or a heavily doped semiconductor material. The optional conductive plate layer 6, for example, may include a tungsten or tungsten silicide layer having a thickness in a range from 3 nm to 100 nm, although lesser and greater thicknesses can also be employed. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 can include a metallic compound material such as a conductive metallic silicide or nitride (e.g., TiN) and/or a metal (e.g., W). The thickness of the optional conductive plate layer 6 may be in a range from 5 nm to 100 nm, although lesser and greater thicknesses can also be employed.

The in-process source-level material layers 10' can include various layers that are subsequently modified to form source-level material layers. The source-level material layers, upon formation, include a source contact layer that functions as a common source region for vertical field effect transistors of a three-dimensional memory device. In one embodiment, the in-process source-level material layer 10' can include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source-select-level conductive layer 118.

The lower source-level material layer 112 and the upper source-level material layer 116 can include a doped semiconductor material such as doped polysilicon or doped amorphous silicon. The conductivity type of the lower source-level material layer 112 and the upper source-level material layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be employed.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon, polysilicon, or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be employed. The optional source-select-level conductive layer 118 can include a conductive material that can be employed as a source-select-level gate electrode. For example, the optional source-select-level conductive layer 118 can include a heavily doped semiconductor material such as heavily doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be employed.

The in-process source-level material layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface 7 of the substrate 8).

The optional conductive plate layer 6 and the in-process source-level material layers 10' may be patterned to provide openings in areas in which through-memory-level contact via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed. The optional conductive plate layer 6 and the in-process source-level material layers 10' can be patterned as needed. The region in which the in-process source-level material layers 10' are present include a memory array region 100 in which memory devices are to be subsequently formed and a contact region 300 in which stepped surfaces and contact via structures contacting various electrically conductive layers are to be subsequently formed.

Figure 2:
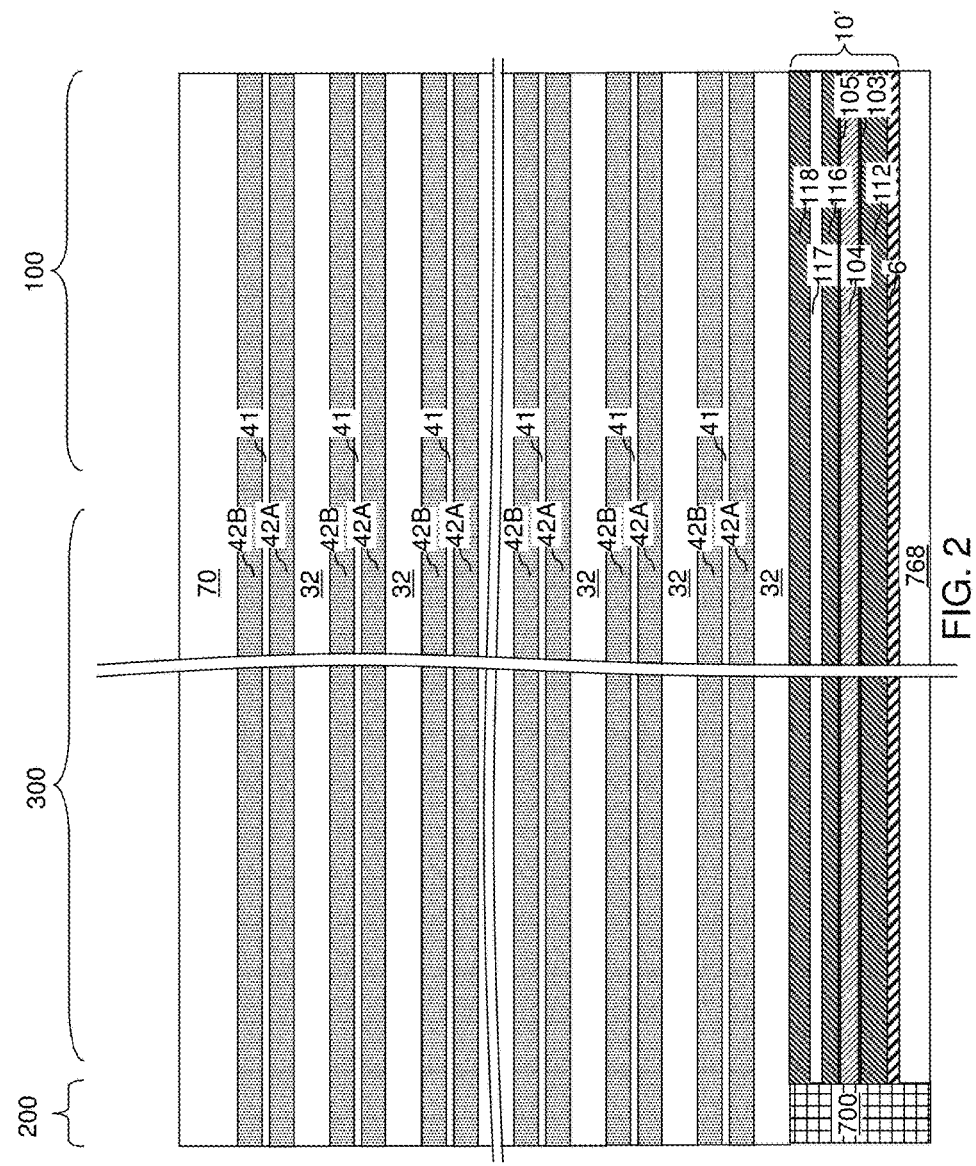
FIG. 2 is a schematic vertical cross-sectional view of the first exemplary structure after formation of a vertical layer stack including multiple repetitions of a unit layer stack including a lower sacrificial material layer, a spacer material layer, an upper sacrificial material layer, and an insulating layer according to the first embodiment of the present disclosure.

Referring to FIG. 2, a vertical layer stack including multiple repetitions of a unit layer stack (42A, 41, 42B, 32) including a lower sacrificial material layer 42A, a spacer material layer 41, an upper sacrificial material layer 42B, and an insulating layer 32 is formed over the in-process source level layers 10'. In one embodiment, the order of layers within each unit layer stack (42A, 41, 42B, 32) may be an insulating layer 32, a lower sacrificial material layer 42A, a spacer material layer 41, and an upper sacrificial material layer 42B. Alternatively, a bottommost insulating layer 32 may be formed on the in-process source-level material layers, and the order of layers within each unit layer stack (42A, 41, 42B, 32) may be a lower sacrificial material layer 42A, a spacer material layer 41, an upper sacrificial material layer 42B, and an insulating layer 32. In this case, the bottommost insulating layer 32 may have the same thickness as, or may have a greater thickness than, overlying insulating layers 32.

The insulating layers 32 include a first material, which is an insulating material. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The lower sacrificial material layers 42A and the upper sacrificial material layers 42B include a second material. The second material of the lower sacrificial material layers 42A and the upper sacrificial material layers 42B is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The lower sacrificial material layers 42A and the upper sacrificial material layers 42B may comprise an insulating material, a semiconductor material, or a conductive material. The second material of the lower sacrificial material layers 42A and the upper sacrificial material layers 42B can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon).

The spacer material layers 41 include a third material, which may be the same as, or different from, the first material. In one embodiment, the insulating layers 32 can include silicon oxide, and the lower sacrificial material layers 42A and the upper sacrificial material layers 42B can include silicon nitride sacrificial material layers. The spacer material layers 41 can include a silicon oxide material such as undoped silicate glass or a doped silicate glass. In an alternative embodiment that will be described below, the spacer material layers 41 may comprise doped polysilicon which are subsequently patterned to form floating gates for a hybrid memory device.

The vertical layer stack (42A, 41, 42B, 32) can be deposited by a series of chemical vapor deposition (CVD) processes. The thicknesses of each insulating layer 32 can be in a range from 20 nm to 50 nm, although lesser and greater thicknesses can be employed. The thickness of each of the lower sacrificial material layers 42A and the upper sacrificial material layers 42B can be in a range from 10 nm to 30 nm, although lesser and greater thicknesses can be employed. The thickness of each spacer material layer 41 can be in a range from 2 nm to 5 nm, although lesser and greater thicknesses can be employed. In one embodiment, the ratio of the thickness of each insulating layer 32 to the thickness of each sacrificial material layer can be in a range from 4 to 20, although lesser and greater ratios can also be employed. The number of repetitions of the unit layer stacks (42A, 41, 42B, 32) can be in a range from 2 to 1,024, and typically from 8 to 256, although a greater number of repetitions can also be employed.

Optionally, an insulating cap layer 70 can be formed over the vertical layer stack (42A, 41, 42B, 32). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
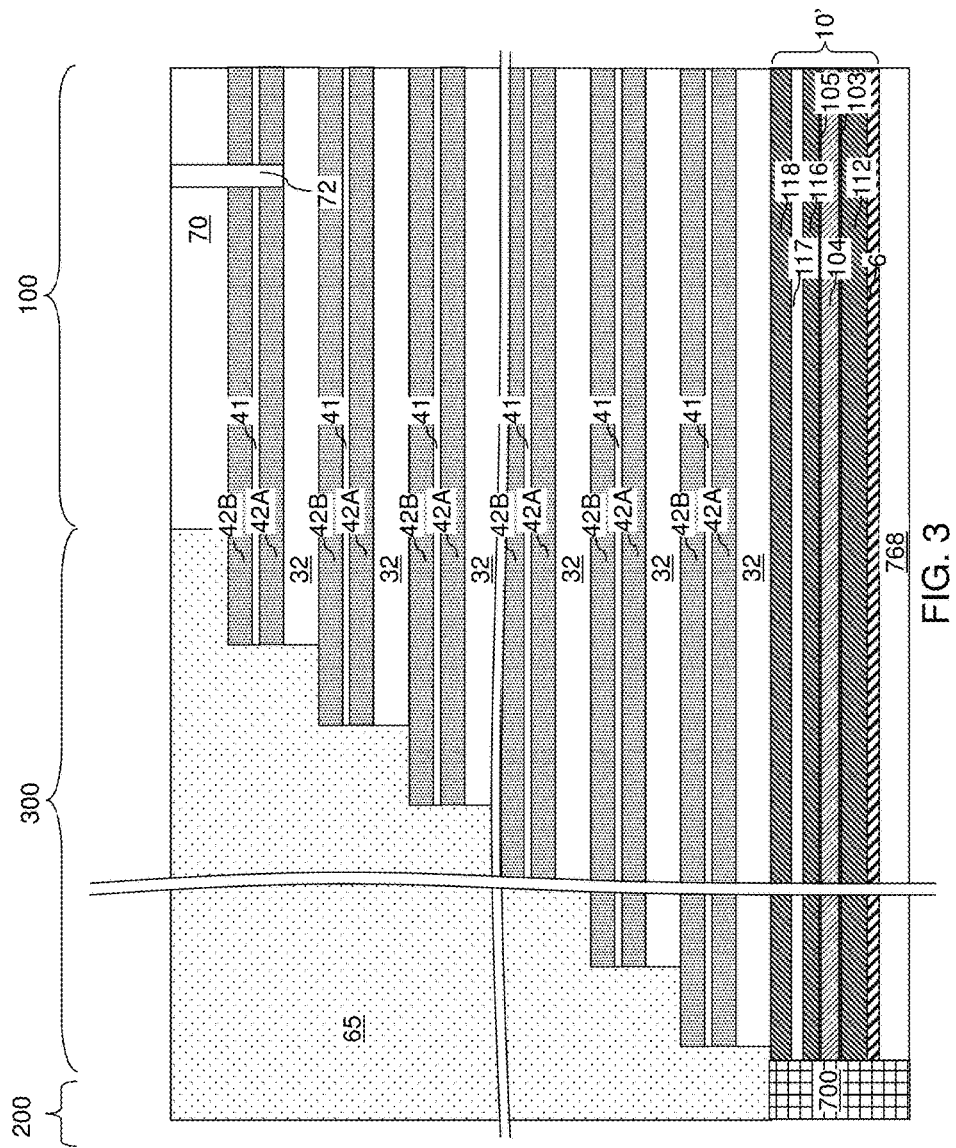
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the vertical layer stack (42A, 41, 42B, 32), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the vertical layer stack (42A, 41, 42B, 32) are removed through formation of the stepped surfaces. A "stepped cavity" refers to a cavity having stepped surfaces.

The terrace region is formed in the contact region 300, which is located between the memory array region 100 and a peripheral device region 200 containing the at least one semiconductor device 700 for the peripheral circuitry. The stepped cavity can have various stepped surfaces such that the horizontal cross-sectional shape of the stepped cavity changes in steps as a function of the vertical distance from the top surface of the substrate 8. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each upper sacrificial material layers 42B other than a topmost upper sacrificial material layers 42B within the vertical layer stack (42A, 41, 42B, 32) laterally extends farther than any overlying upper sacrificial material layers 42B within the vertical layer stack (42A, 41, 42B, 32) in the terrace region. In one embodiment, each lower sacrificial material layer 42A can have a same lateral extent as a most proximal overlying upper sacrificial material layer 42B. The terrace region includes stepped surfaces of the vertical layer stack (42A, 41, 42B, 32) that continuously extend from a bottommost layer within the vertical layer stack (42A, 41, 42B, 32) to a topmost layer within the vertical layer stack (42A, 41, 42B, 32).

Each vertical step of the stepped surfaces can have the height of one or more unit layer stacks (42A, 41, 42B, 32).

In one embodiment, each vertical step can have the height of a single unit layer stack (42A, 41, 42B, 32). In another embodiment, multiple "columns" of staircases can be formed along a first horizontal direction such that each vertical step has the height of a plurality of unit layer stacks (42A, 41, 42B, 32). Each column of staircase can be vertically offset among one another along a second horizontal direction.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
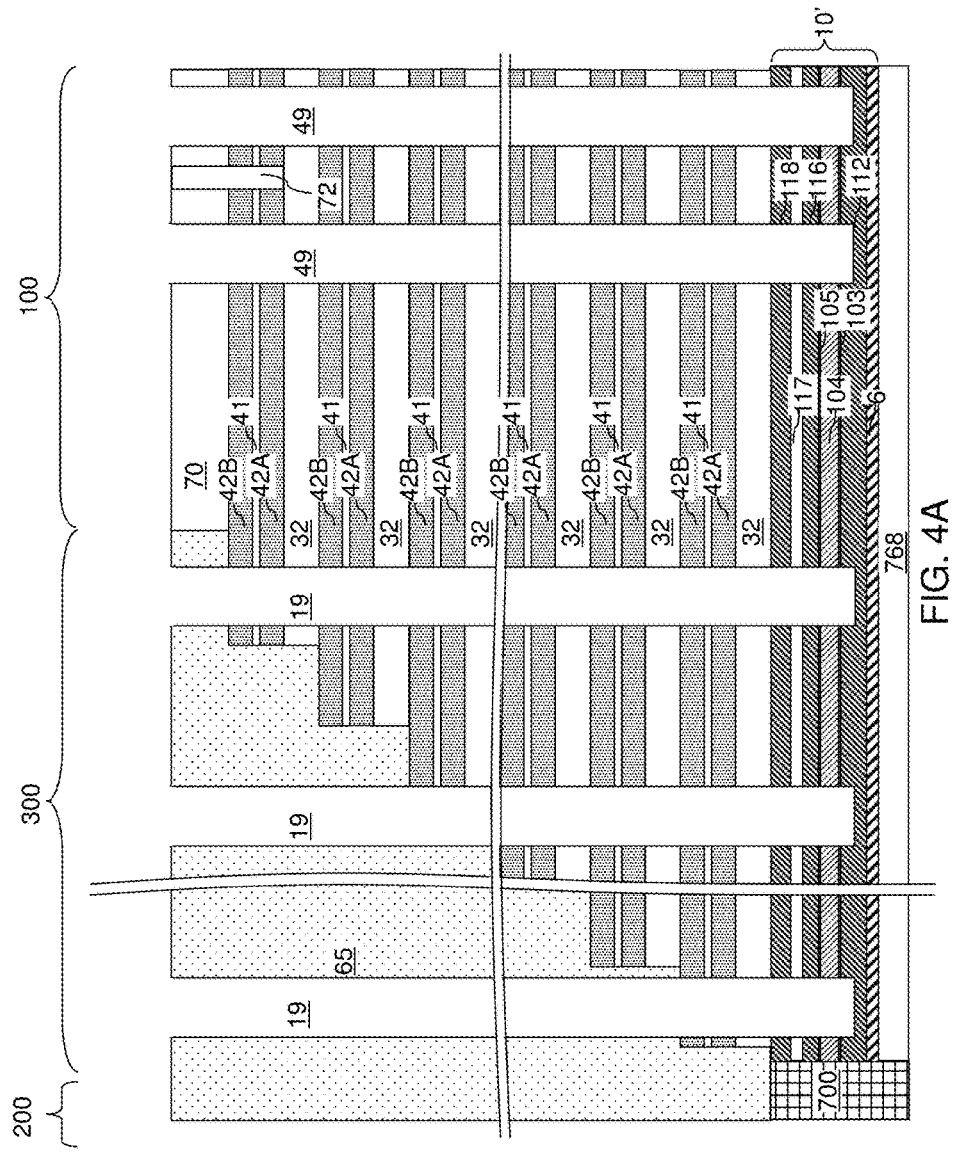
FIG. 4A is a schematic vertical cross-sectional view of the first exemplary structure after formation of memory openings and support openings according to the first embodiment of the present disclosure.
Figure 4B:
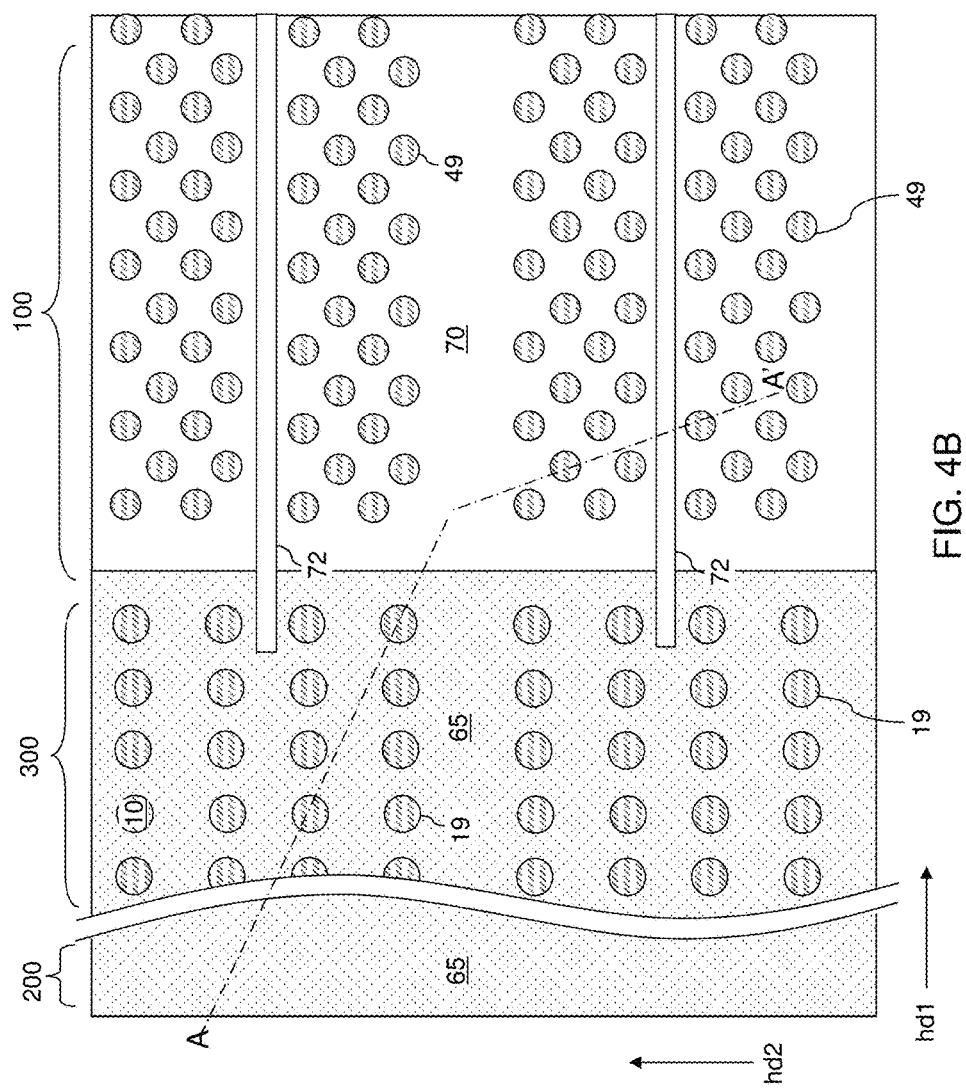
FIG. 4B is a top-down view of the first exemplary structure of FIG. 4A. The vertical plane A-A' is the plane of the cross-section for FIG. 4A.

Referring to FIGS. 4A, 4B, and 5A, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the vertical layer stack (42A, 41, 42B, 32) by at least one anisotropic etch that employs the patterned lithographic material stack as an etch mask. Portions of the vertical layer stack (42A, 41, 42B, 32) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the vertical layer stack (42A, 41, 42B, 32) in the memory array region 100. The support openings 19 are formed through the retro-stepped dielectric material portion 65 and the portion of the vertical layer stack (42A, 41, 42B, 32) that underlie the stepped surfaces in the contact region 300.

The memory openings 49 extend through the entirety of the vertical layer stack (42A, 41, 42B, 32). The support openings 19 extend through a subset of layers within the vertical layer stack (42A, 41, 42B, 32). The chemistry of the anisotropic etch process employed to etch through the materials of the vertical layer stack (42A, 41, 42B, 32) can alternate to optimize etching of the first and second materials in the vertical layer stack (42A, 41, 42B, 32). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the vertical layer stack (42A, 41, 42B, 32) into the in-process semiconductor material layers 10'. In one embodiment, the memory openings 49 and the support openings 19 can extend into the lower source-level material layer 112. In this case, each of the memory openings 49 and the support openings 19 may include a sidewall (or a plurality of sidewalls) that extends substantially perpendicular to a respective recessed surface of the lower source-level material layer 112. A two-dimensional array of memory openings 49 can be formed in the memory array region 100. A two-dimensional array of support openings 19 can be formed in the contact region 300.

Referring to FIG. 5B, the second material of the upper and lower sacrificial material layers (42A, 42B) can be laterally recessed selective to the first material of the insulating layers 32 and the third material of the spacer material layers 41. An isotropic etch process can be employed to laterally recess sidewalls of the second material of the upper and lower sacrificial material layers (42A, 42B) around each memory opening 49 and each support opening. In one embodiment, the isotropic etching of the second material of the upper and lower sacrificial material layers (42A, 42B) can be performed selective to the materials of the in-process source level material layers 10'. In one embodiment, the second material of the upper and lower sacrificial material layers (42A, 42B) can include silicon nitride, the first material and the third material of the insulating layers 32 and the spacer material layers 41 can include silicon oxide, and the isotropic etch process can be performed employing hot phosphoric acid.

Annular recesses 343 are formed by the isotropic etch process. The annular recesses 343 are formed around each memory opening 49 at each level of the lower sacrificial material layers 42A and the upper sacrificial material layers 42B. The lateral etch distance of the isotropic etch process can be in a range from 10 nm to 100 nm, although lesser and greater lateral etch distances can also be employed. Annular top surfaces and annular bottom surfaces of the spacer material layers 41 are physically exposed to the annular recesses 343 after the isotropic etch process. Each physically exposed annular top surface and each physically exposed annular bottom surface of the spacer material layers 41 can have a respective inner periphery and a respective outer periphery. Because of the isotropic nature of the etch process employed to form the annular recesses 343, the distance between each pair of an inner periphery of a physically exposed annular surface and an outer periphery of the physically exposed annular surface can be uniform around the memory openings 49, and can be the same as the lateral etch distance.

Referring to FIG. 5C, a silicon oxide liner 51 can be formed on recessed sidewalls of the upper and lower sacrificial material layers (42A, 42B) and on physically exposed surfaces of the spacer material layers 41 after formation of the annular recesses 343. The silicon oxide liner 51 can be formed on silicon nitride upper and lower sacrificial material layers (42A, 42B) and on semiconductor material portions by thermal oxidation or plasma oxidation of physically exposed surface portions of silicon nitride and semiconductor materials (such as the semiconductor materials of the in-process source level material layers 10'), or can be deposited by a conformal deposition method such as low pressure chemical vapor deposition (LPCVD). As such, the silicon oxide liner 51 may be formed as multiple discrete portions, or may be formed as a single continuous material layer. The silicon oxide liner 51 can function as a blocking dielectric material layer, and can have a thickness in a range from 1 nm to 10 nm, such as from 2 nm to 6 nm, although lesser and greater thicknesses can also be employed.

Referring to FIG. 5D, a dielectric metal oxide liner 52 can be deposited by a conformal deposition process over the silicon oxide liner 51. The dielectric metal oxide liner 52 is formed within each of the annular recesses 343 around the memory opening 49 and over portions of the spacer material layers 41 located between neighboring pairs of annular recesses 343. The dielectric metal oxide liner 52 includes a dielectric material that provides a greater dipole effect than silicon oxide. For example, the dielectric metal oxide liner 52 can include, and/or consist essentially of, aluminum oxide. The thickness of the dielectric metal oxide liner 52 can be in a range from 0.6 nm to 3 nm, such as from 1 nm to 2 nm, although lesser and greater thicknesses can also be employed.

Referring to FIG. 5E, a silicon nitride material can be conformally deposited in the remaining volumes of the annular recesses 343. For example, the silicon nitride material can be deposited by a chemical vapor deposition process that forms a continuous silicon nitride material layer in the annular recesses 343 and at peripheries of the memory openings 49 and over the insulating cap layer 70. In one embodiment, an anisotropic or an isotropic etch such as a wet etch can be performed to remove all or parts of the silicon nitride material located outside the annular recesses 343. The remaining portions of the silicon nitride material in the annular recesses 343 constitute annular silicon nitride portions 54. The annular silicon nitride portions 54 are formed in remaining volumes of the annular recesses 343 after formation of the dielectric metal oxide liner 52. The annular silicon nitride portions 54 comprise upper annular silicon nitride portions 54B formed at levels of the upper sacrificial material layers 42B and lower annular silicon nitride portions 54A formed at levels of the lower sacrificial material layers 42A. If all of the silicon nitride material located outside the annular recesses 343 is removed during the etch, then each of the upper and lower annular silicon nitride portions (54B, 54A) is formed as a discrete annular material portion that does not contact any other of the lower annular silicon nitride portions (54B, 54A). Each of the upper and lower annular silicon nitride portions (54B, 54A) has an outer cylindrical surface, an inner cylindrical surface, an upper annular planar surface adjoining the upper peripheries of the outer cylindrical surface and the inner cylindrical surface, and a lower annular planar surface adjoining the lower peripheries of the outer cylindrical surface and the inner cylindrical surface. Alternatively, if only parts of the silicon nitride material located outside the annular recesses 343 are removed, then a continuous silicon nitride layer remains in the memory openings 49, and protruding annular silicon nitride portions 54A, 54B extend away from the continuous silicon nitride layer into the respective annular recesses 343 (e.g., similar to the structure of the second embodiment illustrated in FIG. 18C and described in more detail below).

Referring to FIG. 5F, a tunneling dielectric layer 56 and a semiconductor channel material layer 60L can be sequentially deposited in the memory openings 49 and over the insulating cap layer 70. The tunneling dielectric layer 56 includes a dielectric material through which charge tunneling can be performed under suitable electrical bias conditions. The tunneling dielectric layer 56 is formed on the dielectric metal oxide liner 52 and on inner sidewalls of the upper and lower annular silicon nitride portions (42B, 42A). The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. The semiconductor channel material layer 60L can have a doping of a first conductivity type at a dopant concentration in a range from $1.0\times10^{14}/cm^3$ to $3.0\times10^{17}/cm^3$. A memory cavity 49' is formed in the volume of each memory opening 49 that is not filled with the deposited material layers (51, 52, 54, 56, 60L).

Referring to FIG. 5G, a dielectric material such as undoped silicate glass, a doped silicate glass, or organosilicate glass can be deposited in the memory cavities 49' by a conformal or non-conformal deposition method. The dielectric material can be vertically recessed by a recess etch process such that remaining portions of the dielectric material have top surfaces between the horizontal plane including the top surface of the insulating cap layer 70 and the horizontal plane including the bottom surface of the insulating cap layer 70. Each remaining portion of the dielectric material constitutes a dielectric core 62.

Figure 6:
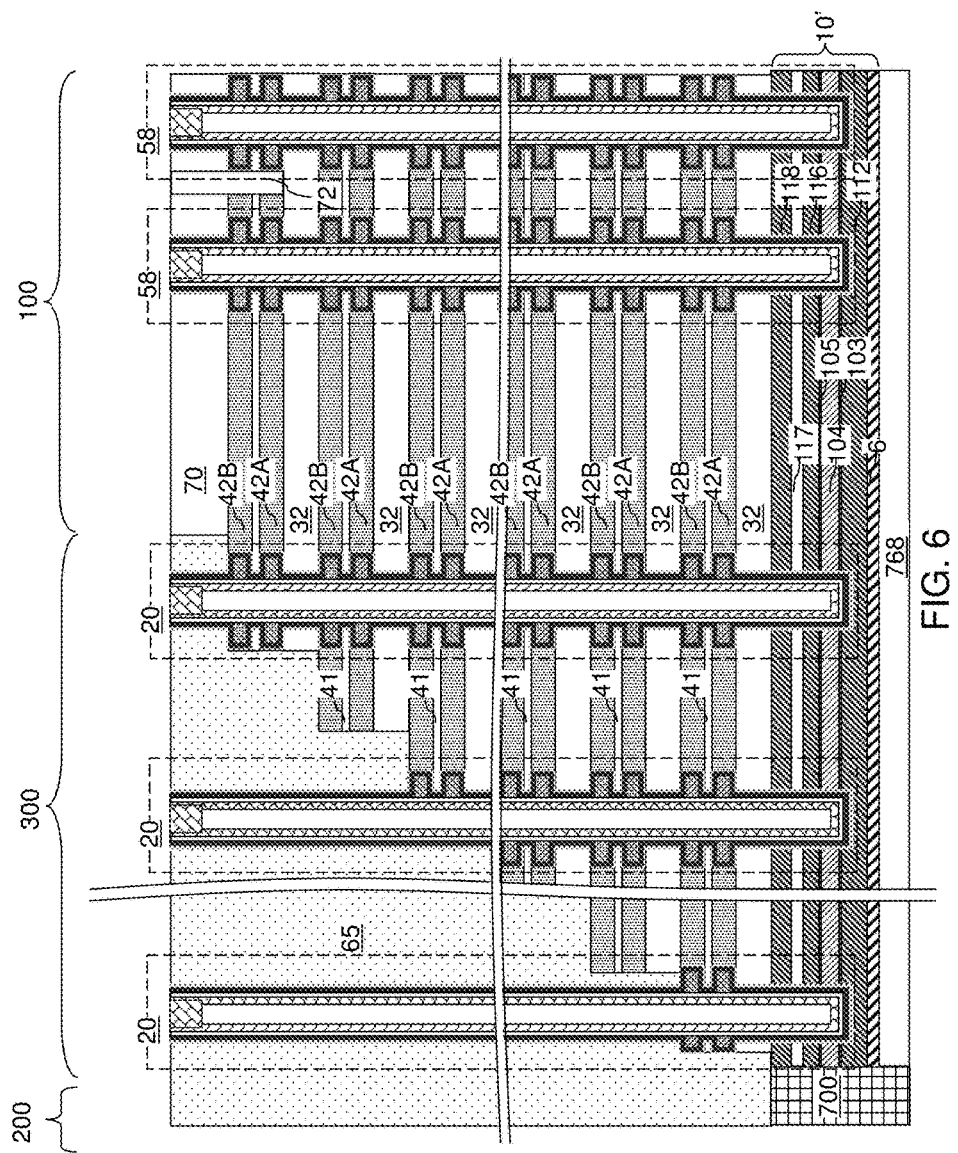
FIG. 6 is a schematic vertical cross-sectional view of the first exemplary structure after formation of memory stack structures and support pillar structures according to the first embodiment of the present disclosure.

Referring to FIGS. 5H and 6, a doped semiconductor material having a doping of a second conductivity type can be deposited in the recesses overlying the dielectric cores 62. Excess portions of the doped semiconductor material, the semiconductor channel material layer 60L, the tunneling dielectric layer 56, the dielectric metal oxide liner 52, and the silicon oxide liner 51 overlying the top surface of the insulating cap layer 70 can be removed by a planarization process employing at least one recess etch process and/or chemical mechanical planarization. Remaining portions of the doped semiconductor material constitute drain regions 63. Remaining portions of the semiconductor channel material layer 60L constitute vertical semiconductor channels 60. The silicon oxide liner 51 is divided into multiple silicon oxide liners 51. The dielectric metal oxide liner 52 is divided into multiple dielectric metal oxide liners 52. The tunneling dielectric layer 56 is divided into multiple tunneling dielectric layers 56.

Each contiguous combination of a silicon oxide liner 51, a dielectric metal oxide liner 52, annular silicon nitride portions 54, and a tunneling dielectric layer 56 constitutes a memory film 50 in which electrical charges are stored during operation of the three-dimensional memory device to be formed. Each combination of a memory film 50 and a vertical semiconductor channel 60 within a memory opening 49 constitutes a memory stack structure 55. Each contiguous set of structures filling a memory opening constitutes a memory opening fill structure 58, which can include a memory stack structure 55, a dielectric core 62, and a drain region 63. Each combination of a memory film 50, a vertical semiconductor channel 60, a dielectric core 62, and a drain region 63 within each support opening 19 fills the respective support openings 19, and constitutes a support pillar structure.

Figure 7A:
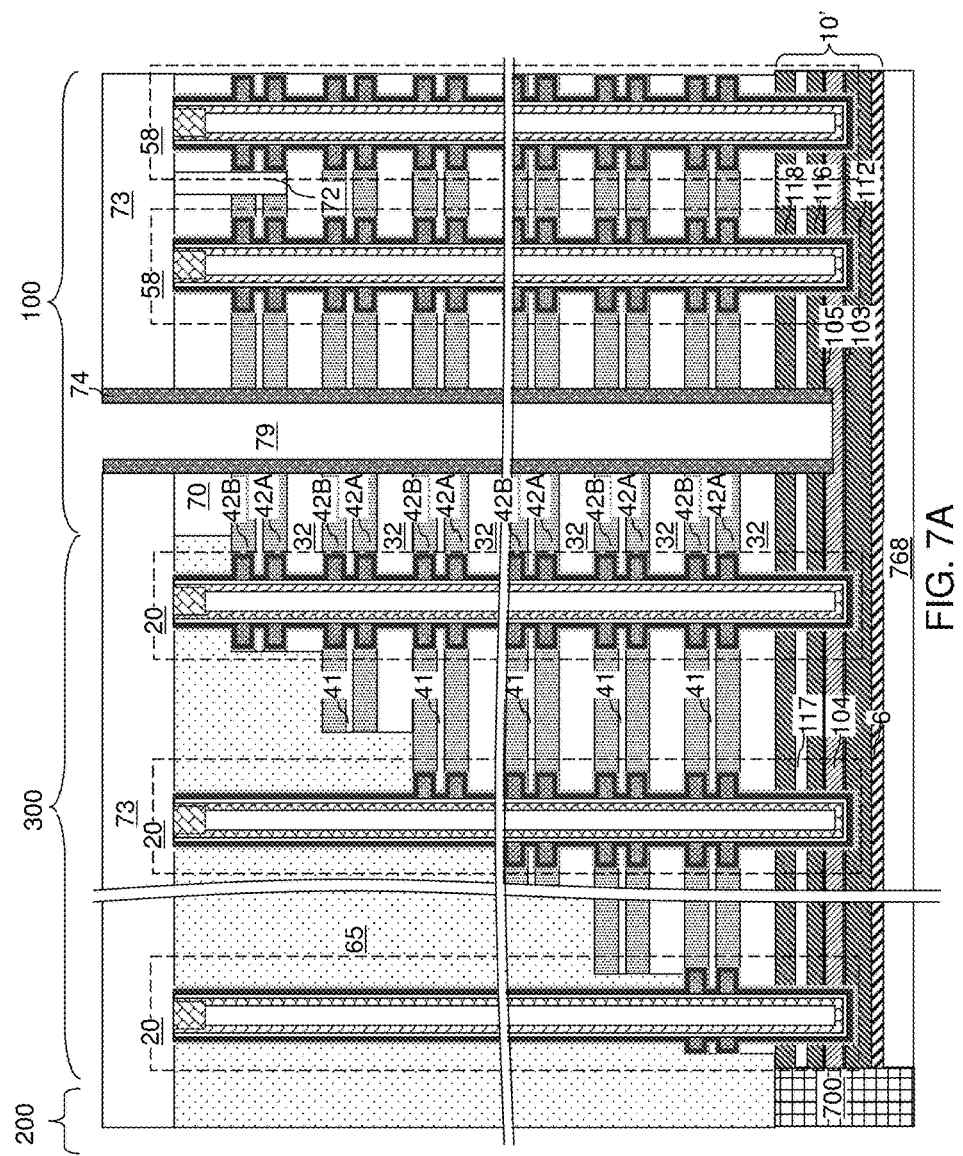
FIG. 7A is a schematic vertical cross-sectional view of the first exemplary structure after formation of backside trenches and sacrificial spacers according to the first embodiment of the present disclosure.
Figure 7B:
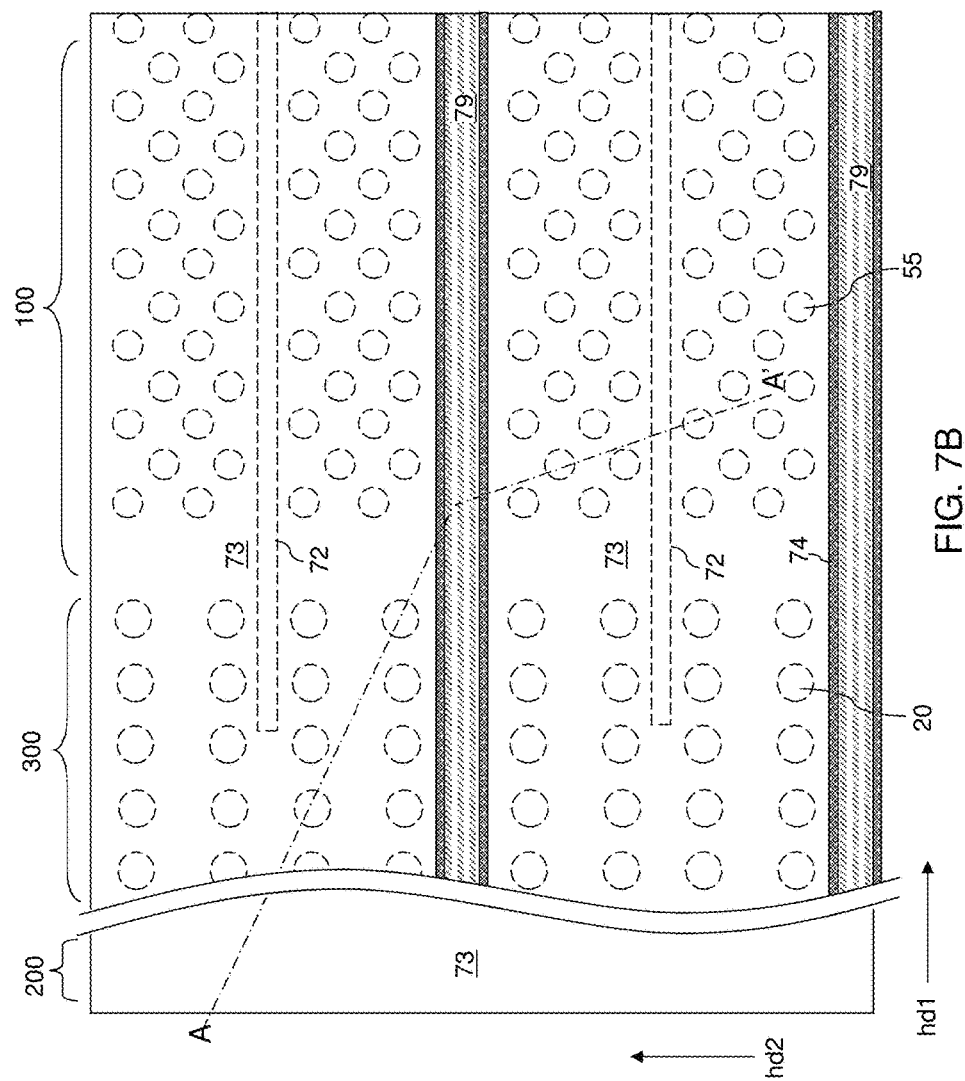
FIG. 7B is a partial see-through top-down view of the first exemplary structure of FIG. 7A. The vertical plane A-A' is the plane of the schematic vertical cross-sectional view of FIG. 7A.
Figure 8A:
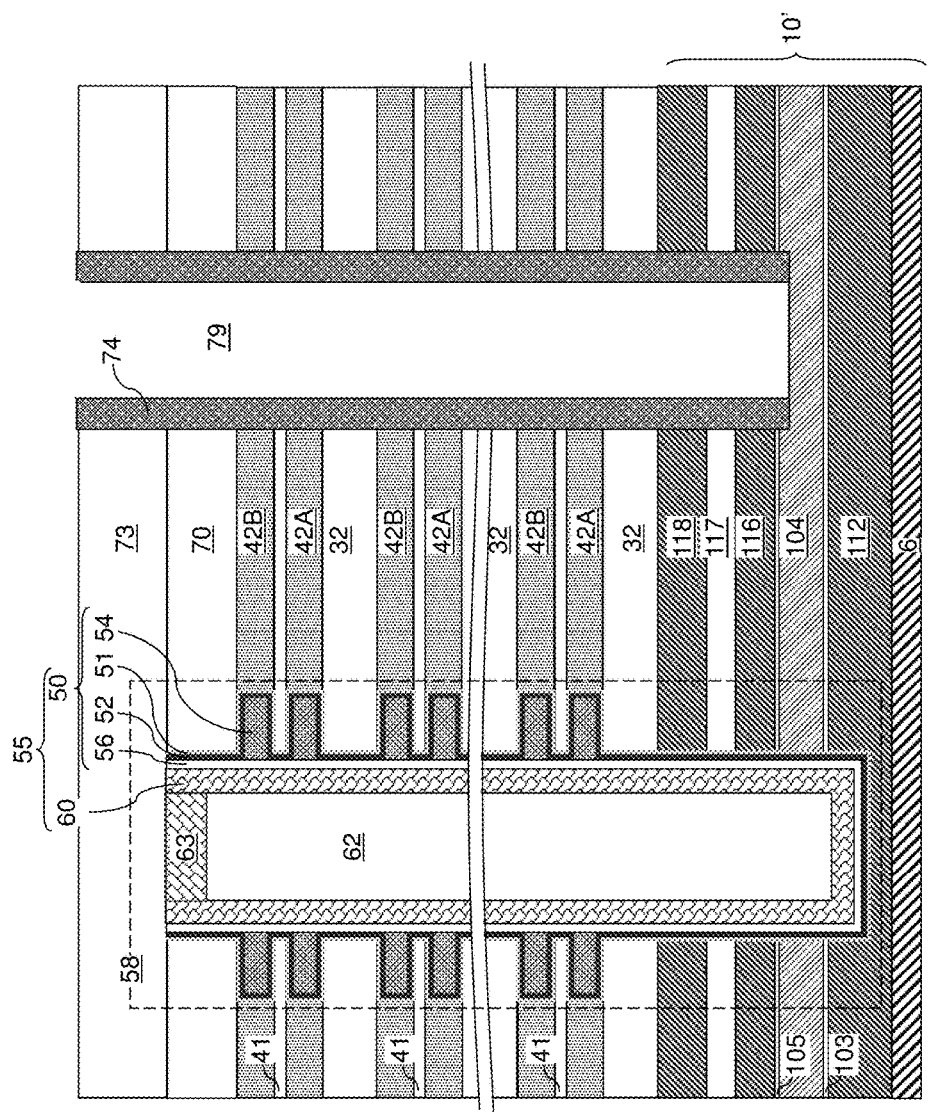

Referring to FIGS. 7A, 7B, and 8A, a contact level dielectric layer 73 can be formed over the vertical layer stack (42A, 41, 42B, 32), and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the vertical layer stack (42A, 41, 42B, 32) and/or the retro-stepped dielectric material portion 65 employing an anisotropic etch to form backside trenches 79, which vertically extend from the top surface of the contact level dielectric layer 73 to a top surface of the source-level sacrificial layer 104, and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. The photoresist layer can be removed, for example, by ashing.

An etch stop material can be conformally deposited and anisotropically etched to form a backside trench spacer 74 within each backside trench 79. The backside trench spacers 74 are sacrificial spacers that protect the vertical layer stack (42A, 41, 42B, 32) during replacement of the in-process source-level material layers 10' with source-level material layers 10. In one embodiment, the backside trench spacers 74 include silicon nitride.

Figure 8B:
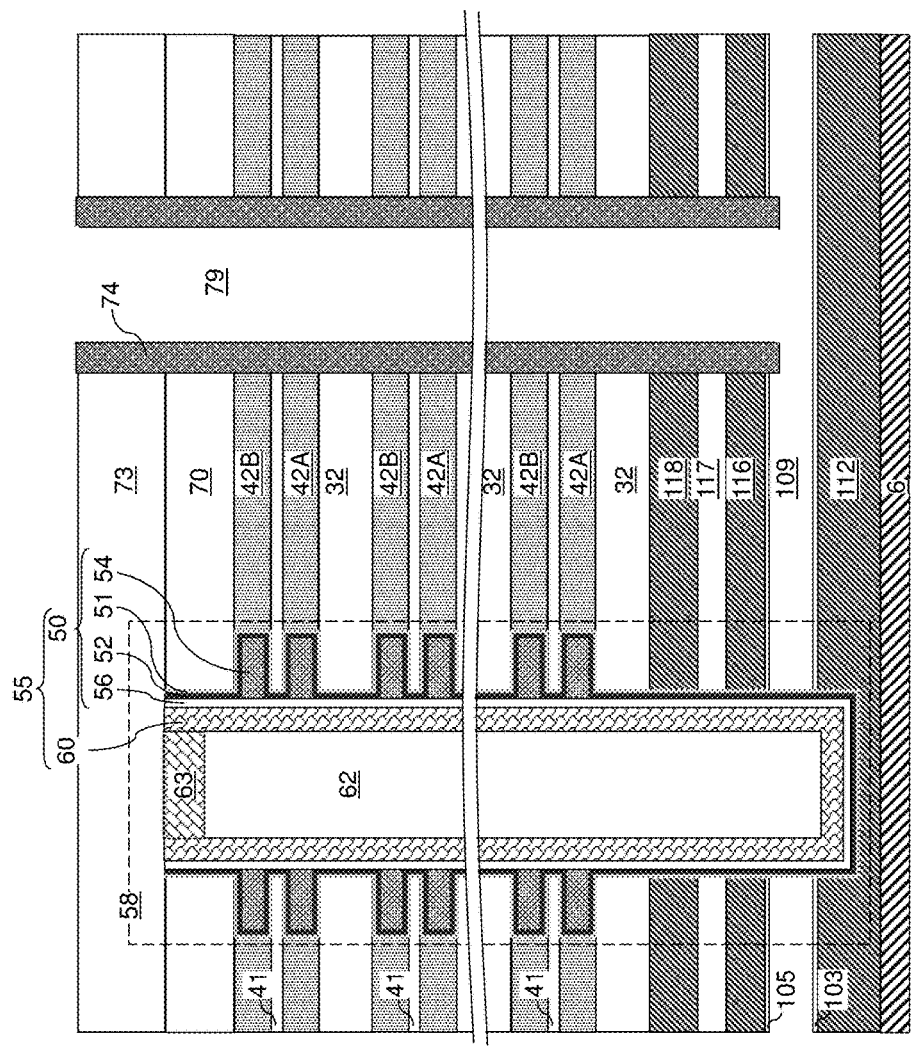

Referring to FIG. 8B, an etchant that etches the material of the source-level sacrificial layer 104 selective to the backside trench spacers 74, the upper sacrificial liner 105, and the lower sacrificial liner 103 can be introduced into the backside trenches in an isotropic etch process. For example, if the source-level sacrificial layer 104 includes undoped amorphous silicon, polysilicon, or an undoped amorphous silicon-germanium alloy, the backside trench spacers 74 include silicon nitride, and the upper and lower sacrificial liners (105, 103) include silicon oxide, a wet etch process employing hot trimethyl-2 hydroxyethyl ammonium hydroxide ("hot TMY") or tetramethyl ammonium hydroxide (TMAH) can be employed to remove the source-level sacrificial layer 104 selective to the backside trench spacers 74 and the upper and lower sacrificial liners (105, 103). A source cavity 109 is formed in the volume from which the source-level sacrificial layer 104 is removed.

Figure 8C:
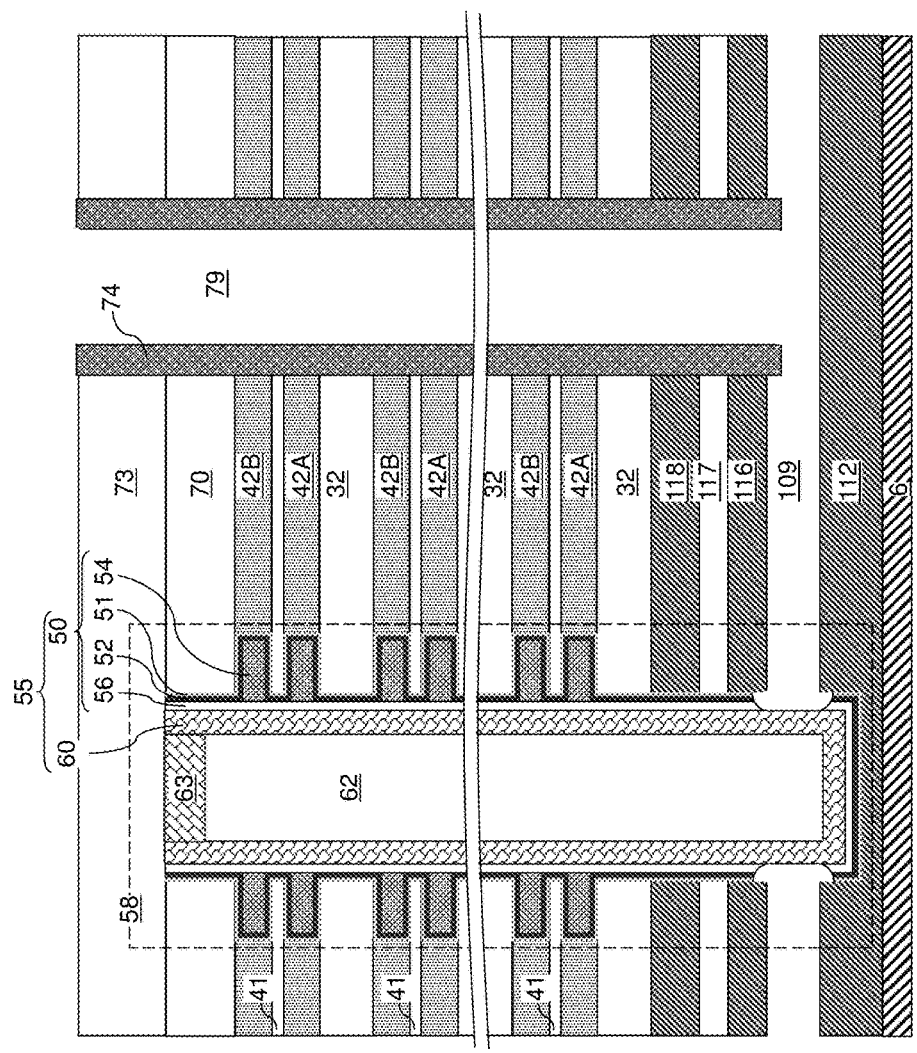

Referring to FIG. 8C, a sequence of isotropic etchants, such as wet etchants, can be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the lower source layer 112 and a bottom surface of the upper source layer 116 can be physically exposed to the source cavity 109.

Referring to FIG. 8D, a doped semiconductor material having a doping of the second conductivity type can be deposited by a selective semiconductor deposition process. A semiconductor precursor gas, an etchant, and a dopant precursor gas can be flowed concurrently into a process chamber including the exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine. The deposited doped semiconductor material forms a source contact layer 114, which can contact sidewalls of the vertical semiconductor channels 60. The duration of the selective semiconductor deposition process can be selected such that the source cavity is filled with the source contact layer 114, and the source contact layer 114 contacts bottom end portions of inner sidewalls of the backside trench spacers 74. Thus, the source contact layer 114 can be formed by selectively depositing a doped semiconductor material from semiconductor surfaces around the source cavity 109. In one embodiment, the doped semiconductor material can include doped polysilicon.

The layer stack including the lower source layer 112, the source contact layer 114, and the upper source layer 116 constitutes a buried source layer (112, 114, 116), which functions as a common source region that is connected each of the vertical semiconductor channels 60 and has a doping of the second conductivity type. The average dopant concentration in the buried source layer (112, 114, 116) can be in a range from $5.0 \times 10^{19}/cm^3$ to $2.0 \times 10^{21}/cm^3$, although lesser and greater dopant concentrations can also be employed. The set of layers including the buried source layer (112, 114, 116), the source-level insulating layer 117, and the optional source-select-level conductive layer 118 constitutes source-level material layers 10, which replaces the in-process source-level material layers 10'.

Figure 8E:
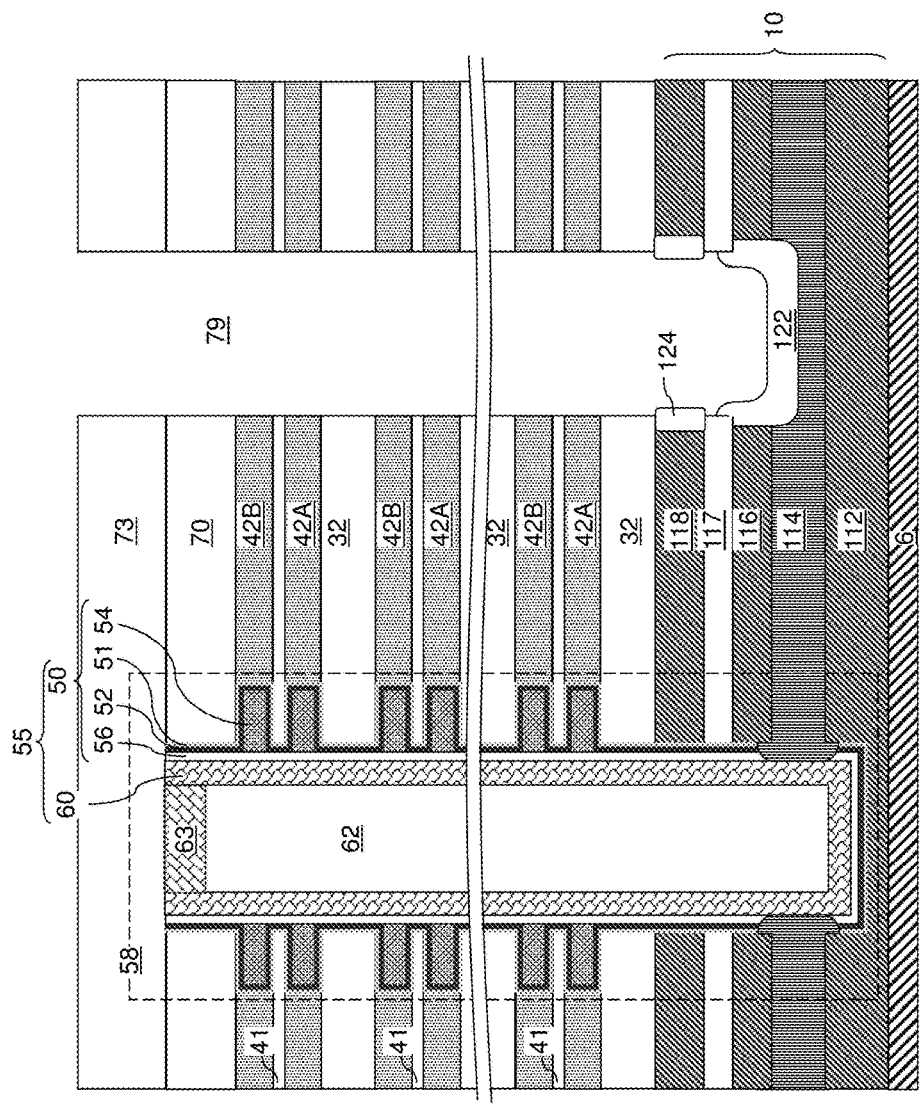
Figure 9:
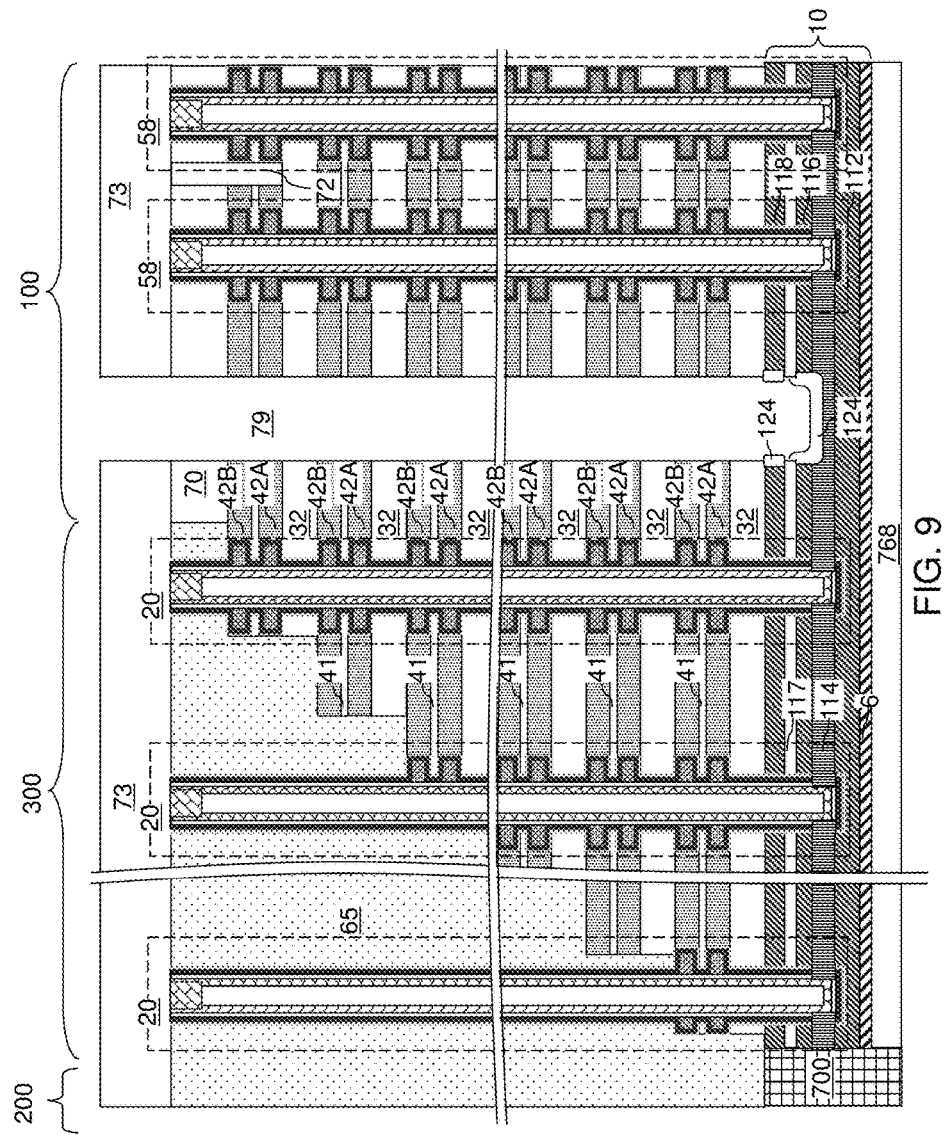
FIG. 9 is a schematic vertical cross-sectional view of the first exemplary structure at the processing steps of FIG. 8E.

Referring to FIGS. 8E and 9, the backside trench spacers 74 can be removed selective to the source contact layer 114 and the insulating layers 32 by an isotropic etch process such as a wet etch process. An oxidation process can be performed to convert physically exposed surface portions of the source contact layer 114, the upper source layer 116, and the source-select-level conductive layer 118 into semiconductor oxide (e.g., silicon oxide) portions. For example, a trench bottom semiconductor oxide structure 122 and an annular semiconductor oxide structure 124 can be formed around each backside trench 79 by oxidation of surface portions of the source contact layer 114, the upper source layer 116, and the source-select-level conductive layer 118.

Figure 10:
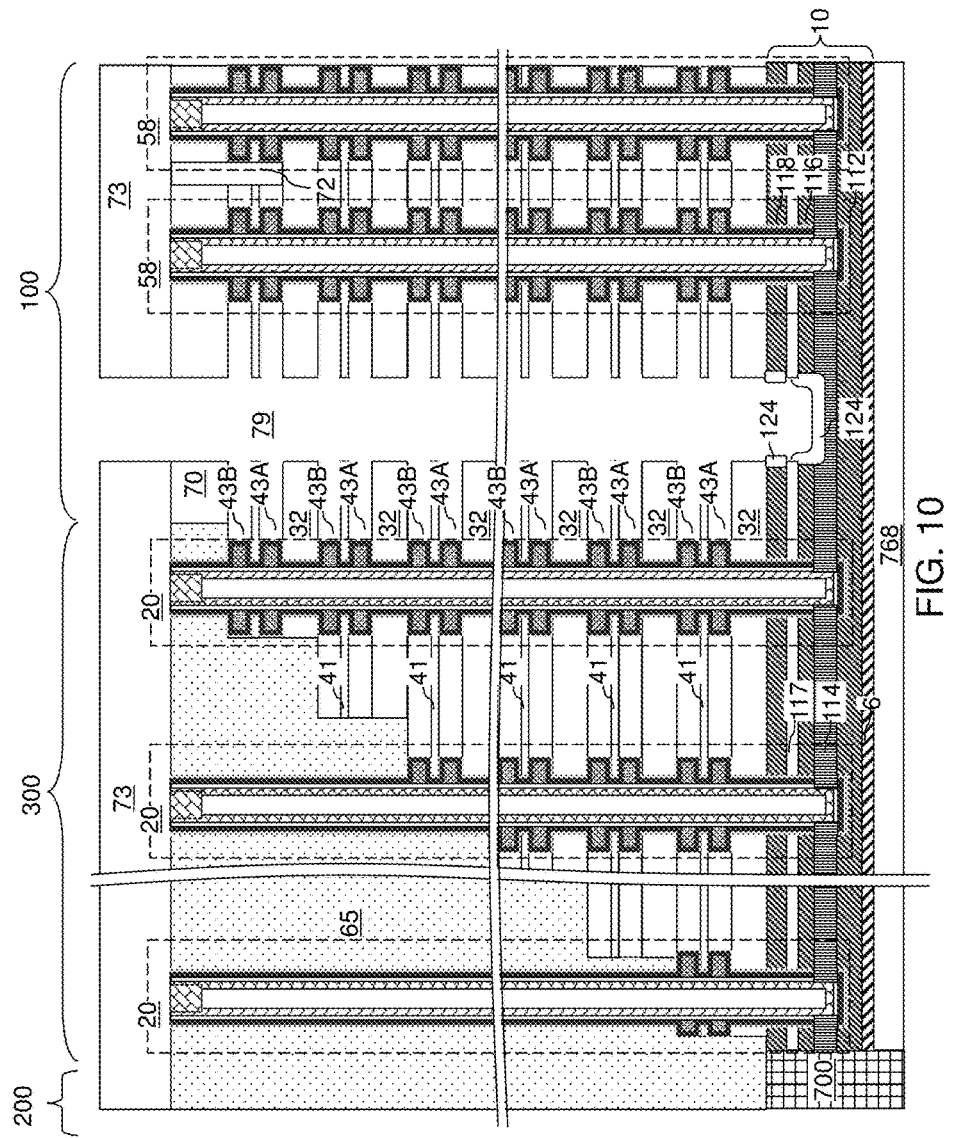
FIG. 10 is a schematic vertical cross-sectional view of the first exemplary structure after formation of in-process backside recesses according to the first embodiment of the present disclosure.

Referring to FIG. 10, an etchant that selectively etches the second material of the upper and lower sacrificial material layers (42B, 42A) with respect to the first material of the insulating layers 32 and the spacer material layers 41 can be introduced into the backside trenches 79, for example, employing an isotropic etch process. Upper backside recesses 43B are formed in volumes from which the upper sacrificial material layers 42B are removed. Lower backside recesses 43A are formed in volumes from which the lower sacrificial material layers 42A are removed. The removal of the second material of the upper and lower sacrificial material layers (42B, 42A) can be selective to the first material of the insulating layers 32, the third material of the spacer material layers 41, the material of the retro-stepped dielectric material portion 65, the semiconductor material of the source-level material layers 10, and the material of the outermost layer of the memory films 50. In one embodiment, the upper and lower sacrificial material layers (42B, 42A) can include silicon nitride, and the materials of the insulating layers 32, the spacer material layers 41, and the retro-stepped dielectric material portion 65 can be silicon oxide.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the upper and lower sacrificial material layers (42B, 43A) include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the upper and lower backside recesses (43B, 42A) are present within volumes previously occupied by the upper and lower sacrificial material layers (42B, 42A).

Figure 11:
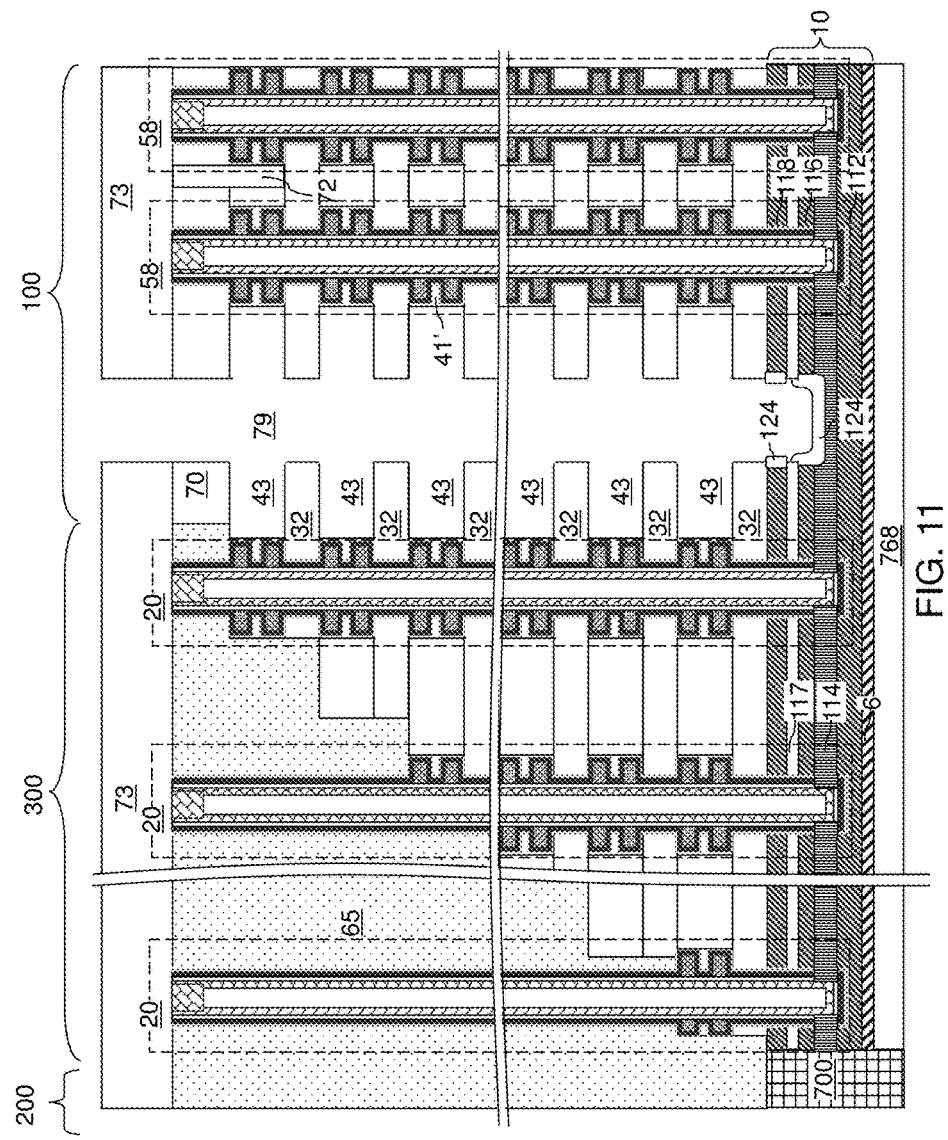
FIG. 11 is a schematic vertical cross-sectional view of the first exemplary structure after formation of backside recesses according to the first embodiment of the present disclosure.
Figures 12A, 12B:
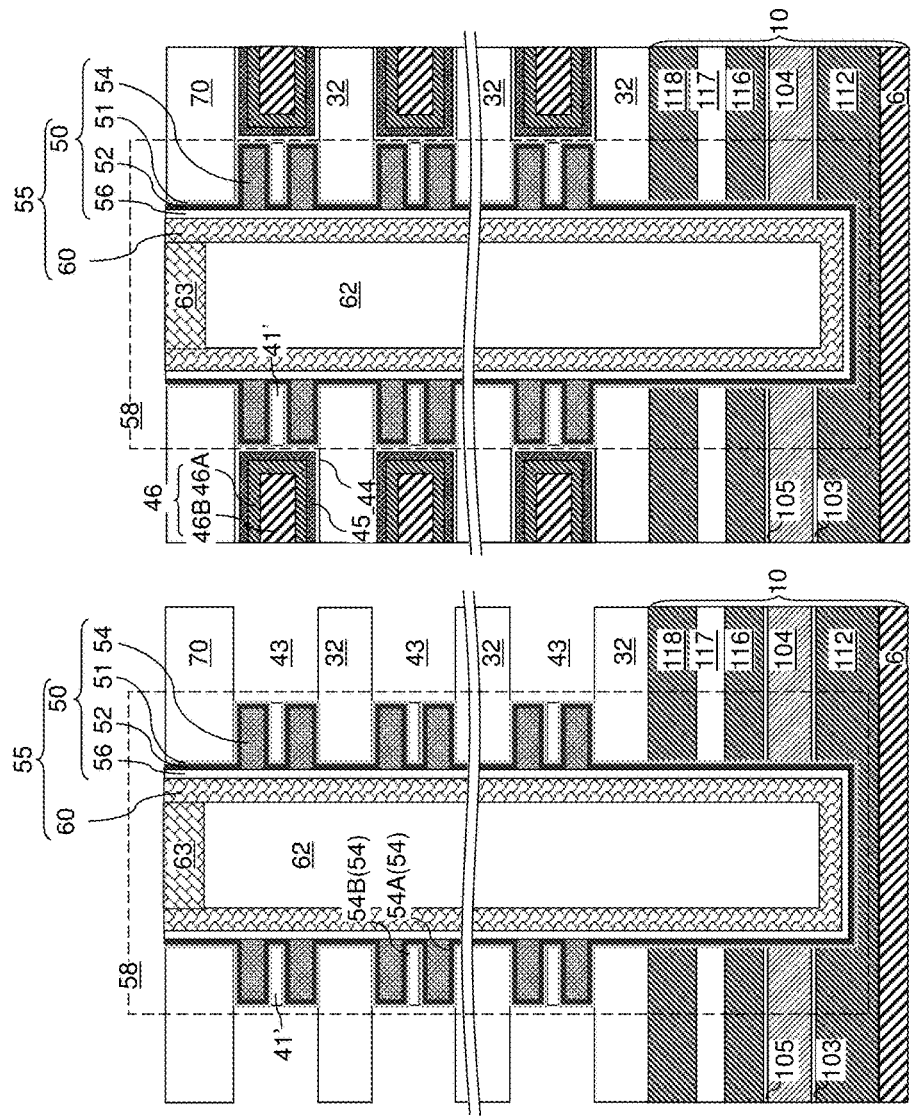
FIGS. 12A and 12B are sequential vertical cross-sectional views of a region of the first exemplary structure during formation of electrically conductive layers according to the first embodiment of the present disclosure.

Referring to FIGS. 11 and 12A, each neighboring pair of an upper backside recess 43B and a lower backside recess 43A is subsequently merged to form a single backside recess 43. As such, each of the upper and lower backside recesses (43B, 43A) are in-process backside recesses. The memory openings 49 in which the memory stack structures 55 are formed are herein referred to as front side openings or front side cavities in contrast with the backside recesses 43. In one embodiment, the spacer material layers 41 can be isotropically etched by an isotropic etch process. For example, if the spacer material layers 41 include a silicate glass material such as undoped silicate glass or doped silicate glass, a wet etch process employing dilute hydrofluoric acid can be employed to remove portions of the spacer material layers 41 located between a vertically neighboring pair of an upper backside recess 43B and a lower backside recess 43A. Each vertical pair of an upper backside recess 43B and a lower backside recess 43A can be joined to form a backside recess 43 that vertically extend between a vertically neighboring pair of insulating layers 32 or between a topmost insulating layer 32 and an insulating cap layer 70. Each remaining portion of the spacer material layers 41 constitutes an annular spacer 41' that laterally surrounds a respective memory stack structure 55. Each annular spacer 41' is located between a respective pair of an upper annular silicon nitride portion 54B and a lower annular silicon nitride portion 54A.

The duration of the isotropic etch process can be selected that the outer sidewall of each annular spacer 41' is located between physically exposed portions of the silicon oxide liner 51 (or the dielectric metal oxide liner 52 in case the silicon oxide liner 51 is formed by thermal or plasma oxidation without deposition of a semiconductor oxide material). As such, the outer sidewall of each annular spacer 41' can be self-aligned to a respective memory opening fill structure 58 or a support pillar structure 20.

In one embodiment, the memory array region 100 comprises an array of monolithic three-dimensional NAND strings having a plurality of device levels disposed above the substrate 8. In this case, each backside recess 43 can define a space for receiving a respective word line of the array of monolithic three-dimensional NAND strings. Each of the plurality of backside recesses 43 can extend substantially parallel to the top surface of the substrate 8. A backside recess 43 can be vertically bounded by a top surface of an underlying insulating layer 32 and a bottom surface of an overlying insulating layer 32. In one embodiment, each backside recess 43 can have a uniform height throughout.

Referring to FIG. 12B, backside blocking dielectric layers (44, 45) can be subsequently formed in the backside recesses 43. The backside blocking dielectric layers (44, 45) can include, for example, a silicon oxide blocking dielectric layer 44 including silicon oxide and a dielectric metal oxide blocking dielectric layer 45 including a dielectric metal oxide such as aluminum oxide. The thickness of the silicon oxide blocking dielectric layer 44 can be in a range from 1 nm to 4 nm, and the thickness of the dielectric metal oxide blocking dielectric layer 45 can be in a range from 1 nm to 4 nm, although lesser and greater thicknesses can also be employed.

It is understood that only one or both of the silicon oxide blocking dielectric layer 44 and the dielectric metal oxide blocking dielectric layer 45 may be employed. The silicon oxide blocking dielectric layer 44 and/or the dielectric metal oxide blocking dielectric layer 45 are referred to as a blocking dielectric layer (44, 45). As such, a blocking dielectric layer (44, 45) may include only a silicon oxide blocking dielectric layer 44, only a dielectric metal oxide blocking dielectric layer 45, or a combination of a silicon oxide blocking dielectric layer 44 and a dielectric metal oxide blocking dielectric layer 45.

A metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. Alternatively, the metallic fill material layer 46B can include a different metallic material such as cobalt, ruthenium, and/or molybdenum. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer includes a continuous portion of the metallic barrier layer 46A and a continuous portion of the metallic fill material layer 46B that are located in the backside trenches 79 or above the contact level dielectric layer 73.

Figure 13:
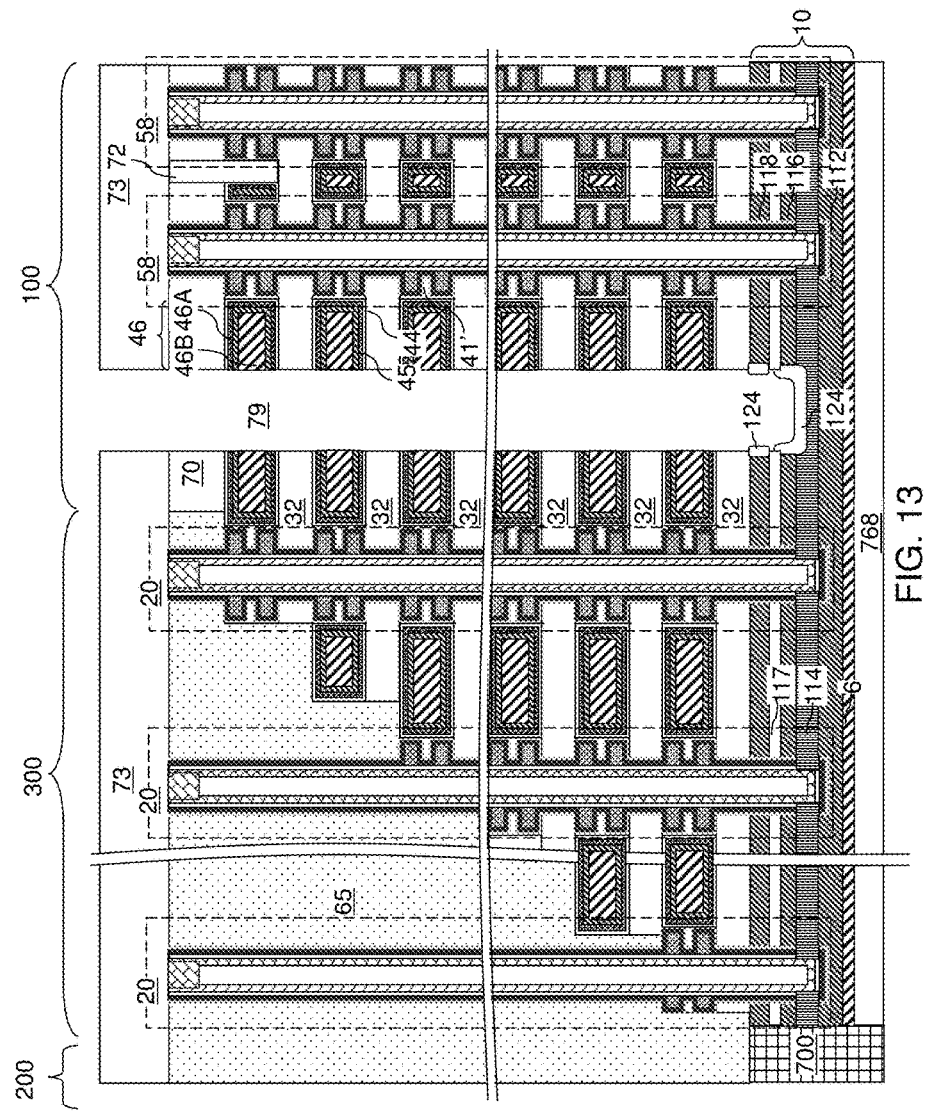
FIG. 13 is a schematic vertical cross-sectional view of the first exemplary structure at the processing step of FIG. 12B.

Referring to FIG. 13, the deposited metallic material of the continuous electrically conductive material layer is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode, or a select gate electrode, for the plurality of vertical memory devices.

Thus, each combination of an upper sacrificial material layer 42B, a lower sacrificial material layer 42A, and an intervening portion of a spacer material layer 41 between the upper and lower sacrificial material layers (42B, 42A) within each unit layer stack (32, 42A, 41, 42B) is replaced with a respective replacement material portion (44, 45, 46A, 46B) that includes a respective electrically conductive layer 46. Each replacement material portion (44, 45, 46A, 46B) comprises a backside blocking dielectric layer (44 and/or 45) that is formed on an outer sidewall of a respective annular spacer 41'. Each electrically conductive layer 46 is formed on a respective blocking dielectric layer (44 and/or 45).

Figure 14:
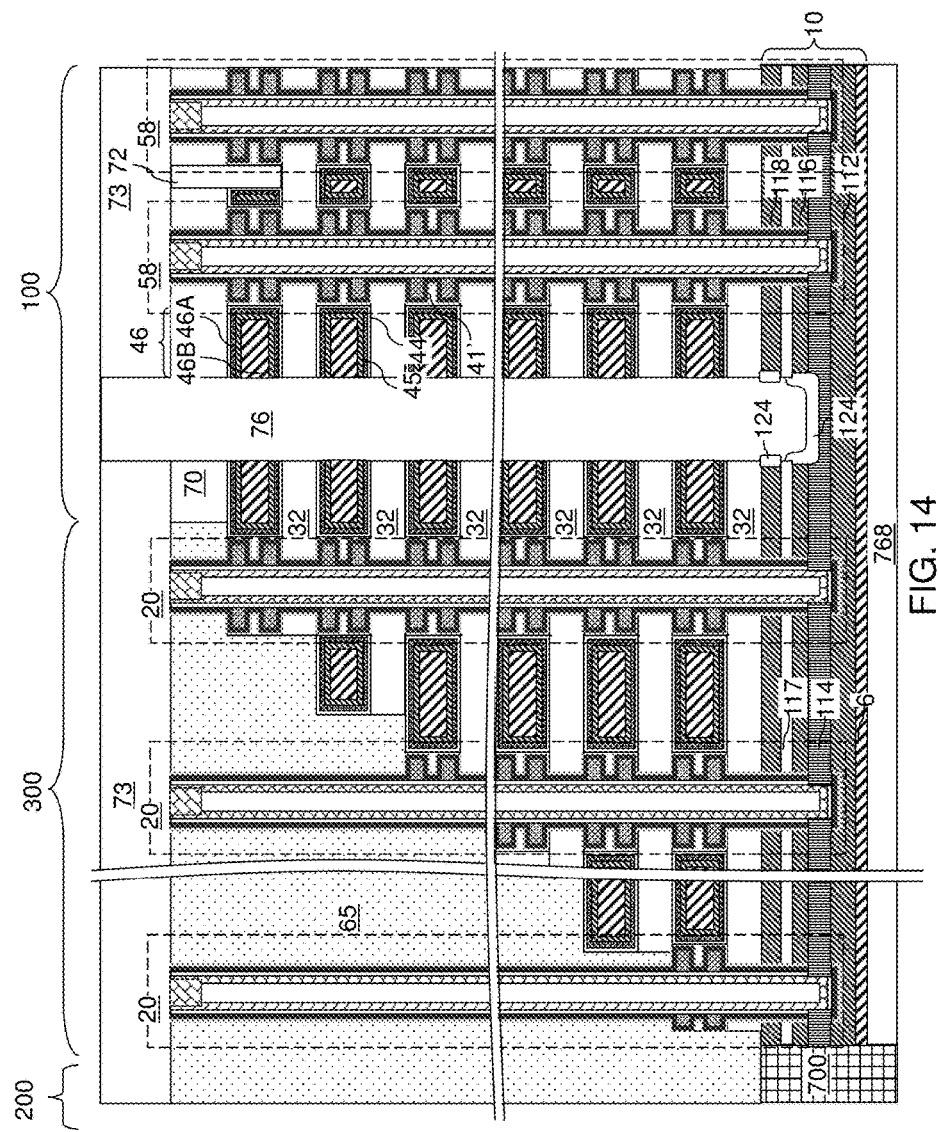
FIG. 14 is a schematic vertical cross-sectional view of the first exemplary structure after formation of a dielectric wall structure within each backside trench according to the first embodiment of the present disclosure.

Referring to FIG. 14, a dielectric material is deposited in the backside trenches to form a dielectric wall structure that laterally extends along the first horizontal direction and vertically extends through each layer of an alternating stack of the insulating layers 32 and the electrically conductive layers 46.

Figure 15A:
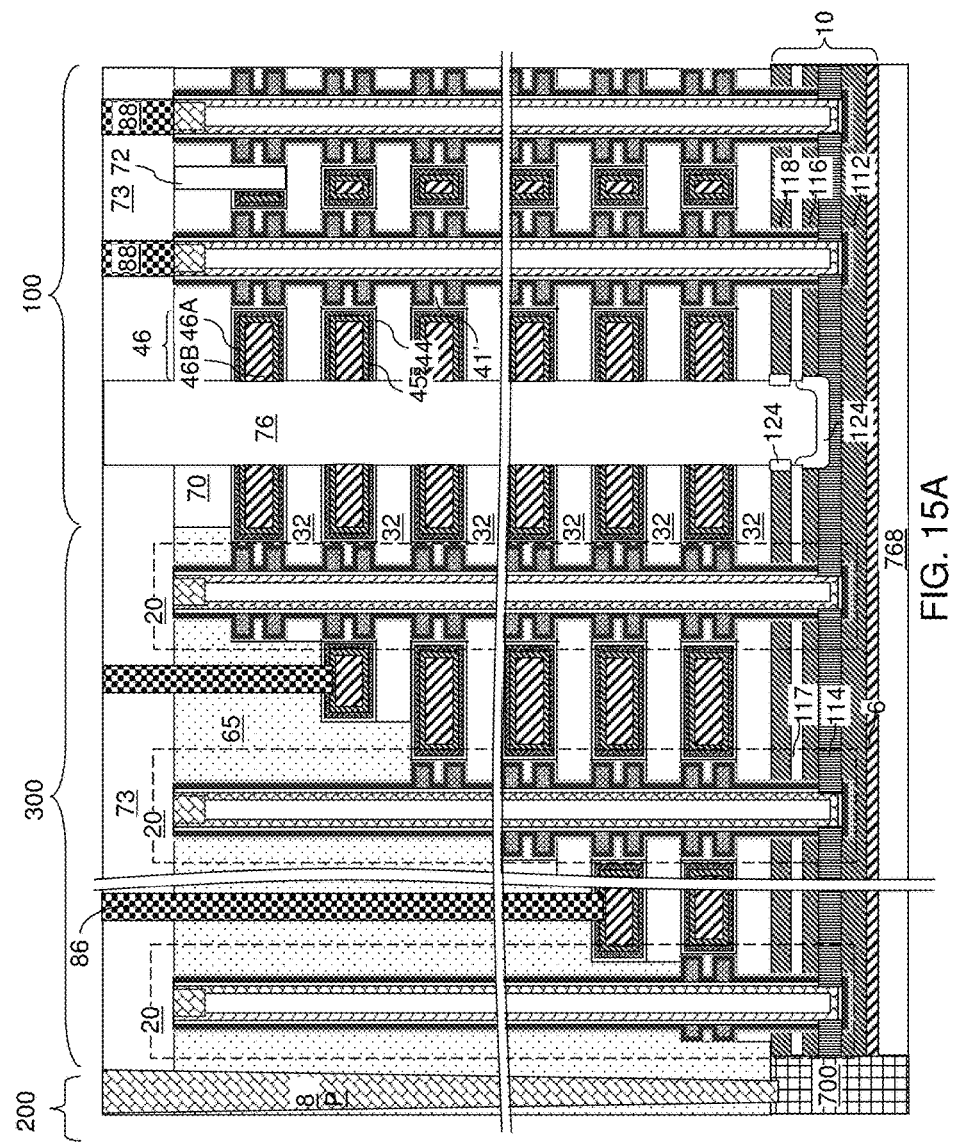
FIG. 15A is a schematic vertical cross-sectional view of the first exemplary structure after formation of additional contact via structures according to the first embodiment of the present disclosure.
Figure 15B:
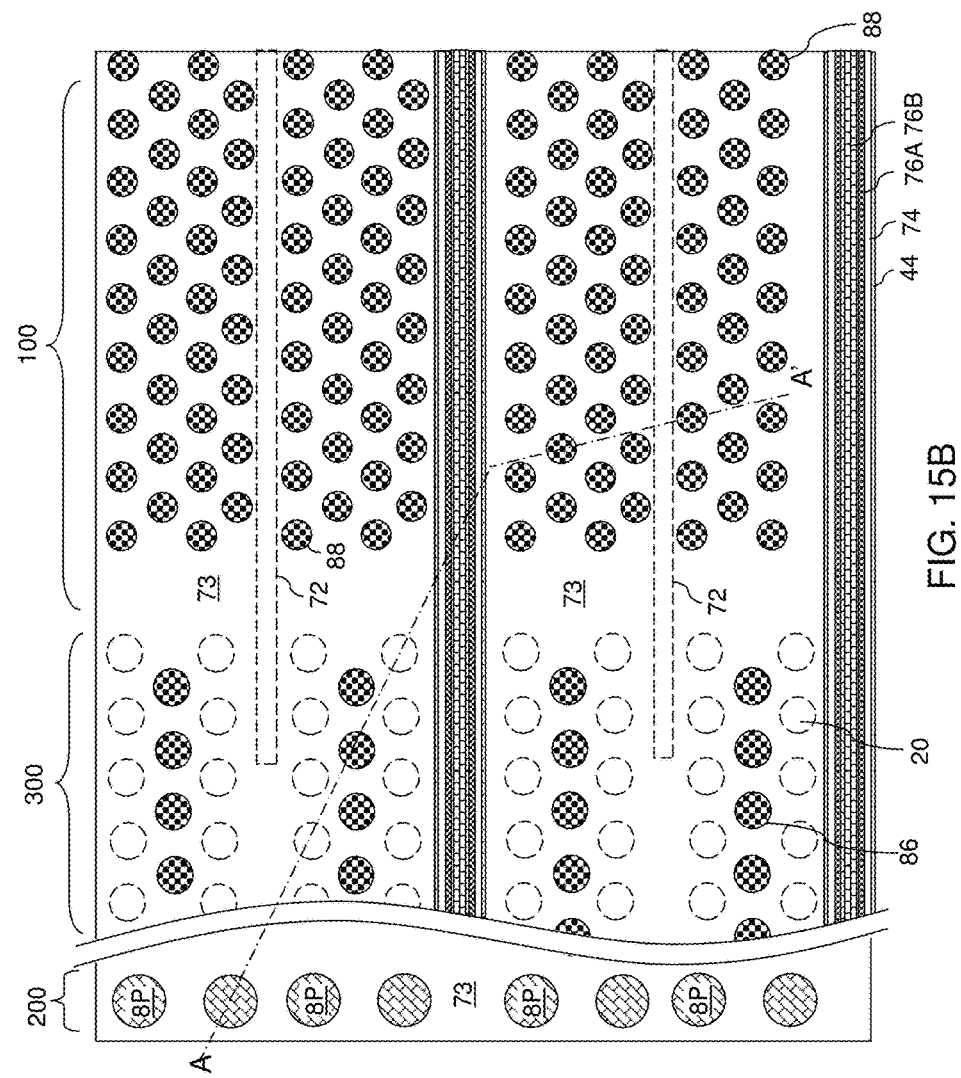
FIG. 15B is a top-down view of the first exemplary structure of FIG. 15A. The vertical plane A-A' is the plane of the schematic vertical cross-sectional view of FIG. 15A.

Referring to FIGS. 15A and 15B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 16:
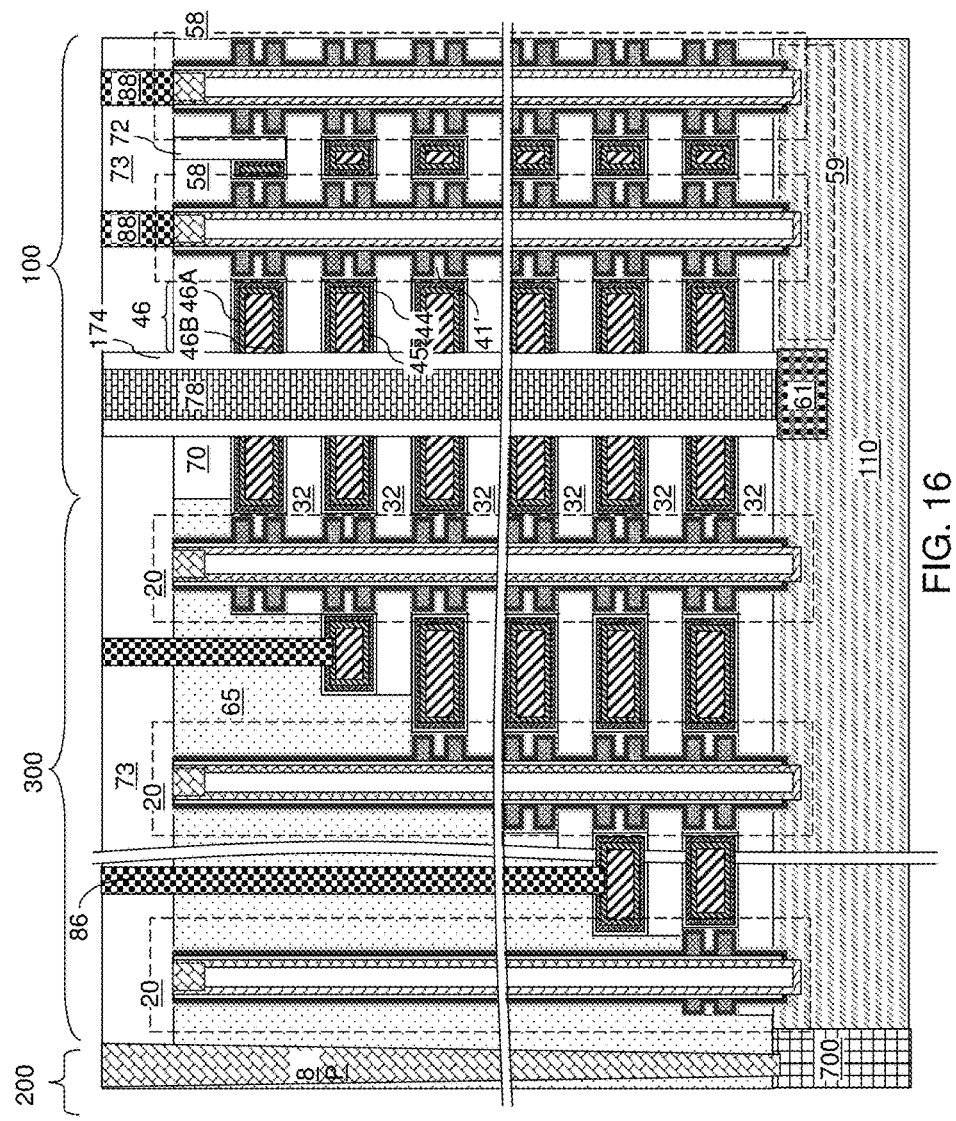
FIG. 16 is a vertical cross-sectional view of an alternative embodiment of the first exemplary structure in which a semiconductor material layer is employed in lieu of source level layers and in which a source contact via structure is formed in lieu of each dielectric wall structure.

Referring to FIG. 16, an alternative embodiment of the first exemplary structure is illustrated, in which a semiconductor material layer 110 is employed in lieu of source level layers 10'. The semiconductor material layer 110 can include a semiconductor material having a doping of the first conductivity type. Source regions 61 having a doping of the second conductivity type can be formed at the bottom of each backside trench, which extends to a top surface of the semiconductor material layer 110. An insulating spacer 174 can be formed at a periphery of each backside trench, and a source contact via structure 78 can be formed directly on each source region 61 within a respective insulating spacer 174. Vertical semiconductor channels 60 of the memory opening fill structures 58 can contact the semiconductor material layer 110. Each surface portion of the semiconductor material layer 110 located between a source region 61 and neighboring interfaces between the semiconductor material layer 110 and vertical semiconductor channels 60 constitutes a horizontal semiconductor channel 59.

The first exemplary structure comprises a three-dimensional memory device. The three-dimensional memory device comprises an alternating stack of insulating layers 32 and electrically conductive layers 46 located over a substrate (8 or 110); and a memory stack structure 55 extending through the alternating stack (32, 46), wherein the memory stack structure 55 comprises a tunneling dielectric layer 56, a vertical semiconductor channel 60 contacting an inner sidewall of the tunneling dielectric layer 56, and a vertical stack of charge storage structures (54B, 54A, 41') located in a recess adjacent to a respective the electrically conductive layer 46. Each of the charge storage structures comprises an upper silicon nitride portion 54B located adjacent to an upper portion of the respective electrically conductive layer 46, a lower silicon nitride portion 54A located adjacent to a lower portion of the respective electrically conductive layer 46, the lower silicon nitride portion underlying the upper silicon nitride portion; and a spacer 41' located between the upper silicon nitride portion and the lower silicon nitride portion.

In one embodiment, an outer sidewall of the annular spacer 41' contacts a vertical portion of a backside blocking dielectric layer (44, 45) that contacts a respective one of the electrically conductive layers 46. In one embodiment, the respective one of the electrically conductive layers 46 is vertically spaced from an overlying one of the insulating layers 32 and from an underlying one of the insulating layers 32 by horizontal portions of the backside blocking dielectric layer (44, 45).

In one embodiment, a dielectric metal oxide liner 52 continuously extends from an outer sidewall of the upper annular silicon nitride portion 54B to an outer sidewall of the lower annular silicon nitride portion 54A and including a vertically extending portion located between an inner sidewall of the annular spacer 41' and the tunneling dielectric layer 56. In one embodiment, a silicon oxide liner 51 is located between the annular spacer 41' and the dielectric metal oxide liner 52 and contacting a first vertical portion of the dielectric metal oxide liner 52 that overlie the annular spacer 41' and a second vertical portion of the dielectric metal oxide liner 52 that underlie the annular spacer 41'.

In one embodiment, the annular spacer 41' comprises a dielectric material (such as aluminum oxide), and the dielectric metal oxide liner 52 comprises an aluminum oxide liner. In one embodiment, the vertically extending portion of the dielectric metal oxide liner 52 contacts a portion of an outer sidewall of the tunneling dielectric layer 56.

Referring to FIG. 17, a second exemplary structure according to a second embodiment of the present disclosure can be derived from the first exemplary structure of FIG. 2 by employing a conductive material or a doped semiconductor material for the spacer material layers 141 in lieu of the spacer material layers 41 including a dielectric material in the first exemplary structure of FIG. 2. For example, the spacer material layers 141 can include a metal (such as tungsten, cobalt, ruthenium, platinum, molybdenum, etc.) or a doped semiconductor material (such as amorphous silicon, polysilicon, a silicon-germanium alloy, etc.). The thickness of each spacer material layer 141 can be in a range from 2 nm to 25 nm, such as from 4 nm to 15 nm, although lesser and greater thicknesses can also be employed. The spacer material layers 141 can be formed by chemical vapor deposition.

Referring to FIG. 18A, the processing steps of FIGS. 3 and 4A, 4B, and 5A can be performed to form memory openings 49 and support openings 19. The etch chemistry of the anisotropic etch process that forms the memory openings 49 and the support openings 19 can be modified to accommodate the change in composition of the spacer material layers 141 relative to the composition of the spacer material layers 41 of the first embodiment.

Referring to FIG. 18B, the processing steps of FIG. 5B can be performed to laterally recess the upper and lower sacrificial material layers (42B, 42A) selective to the insulating layers 32 and the spacer material layers 141. Annular recesses 343 are formed around each memory opening 49 at each level of the lower sacrificial material layers 42A and the upper sacrificial material layers 42B.

Referring to FIG. 18C, a silicon oxide liner 51 can be formed on recessed sidewalls of the upper and lower sacrificial material layers (42A, 42B) and on physically exposed surfaces of the spacer material layers 41 after formation of the annular recesses 343. The silicon oxide liner 51 can be formed by a conformal deposition method such as low pressure chemical vapor deposition (LPCVD). As such, the silicon oxide liner 51 may be formed as a single continuous material layer. The silicon oxide liner 51 can function as a blocking dielectric material layer, and can have a thickness in a range from 1 nm to 10 nm, such as from 2 nm to 6 nm, although lesser and greater thicknesses can also be employed.

A silicon nitride material can be conformally deposited in the remaining volumes of the annular recesses 343 to form a silicon nitride layer 54L. For example, the silicon nitride material can be deposited by a chemical vapor deposition process. The silicon nitride layer 54L can be formed as a continuous silicon nitride material layer located within the annular recesses 343, at peripheries of the memory openings 49 and the support openings 19, and over the insulating cap layer 70. The thickness of the vertical portions of the silicon nitride layer 54L at the periphery of the memory openings 49 can be greater than one half of the height of the annular recesses 343. In this case, the silicon nitride layer 54L comprises a continuous silicon nitride layer containing protruding annular silicon nitride portions 54A, 54B which extend away from the continuous silicon nitride layer 54L into the respective annular recesses 343 to completely fill each remaining volume of the annular recesses 343.

A tunneling dielectric layer 56 can be sequentially deposited on the silicon nitride layer 54L in the memory openings 49 and over the insulating cap layer 70. The tunneling dielectric layer 56 includes a dielectric material through which charge tunneling can be performed under suitable electrical bias conditions. The tunneling dielectric layer 56 can be the same as in the first embodiment.

Referring to FIG. 18D, a vertical semiconductor channel 60, a dielectric core 62, and a drain region 63 can be formed within each memory opening 49 and within each support opening 19 in the same manner as in the first embodiment. The silicon oxide liner 51 is divided into multiple silicon oxide liners 51. The silicon nitride layer 54L is divided into multiple silicon nitride layers 54L. The tunneling dielectric layer 56 is divided into multiple tunneling dielectric layers 56.

Each contiguous combination of a silicon oxide liner 51, a silicon nitride layer 54L containing the silicon nitride portions (54A, 54B) and a tunneling dielectric layer 56 constitutes a memory film 50 in which electrical charges are stored during operation of the three-dimensional memory device to be formed. Each combination of a memory film 50 and a vertical semiconductor channel 60 within a memory opening 49 constitutes a memory stack structure 55. Each contiguous set of structures filling a memory opening constitutes a memory opening fill structure 58, which can include a memory stack structure 55, a dielectric core 62, and a drain region 63. Each combination of a memory film 50, a vertical semiconductor channel 60, a dielectric core 62, and a drain region 63 within each support opening 19 fills the respective support openings 19, and constitutes a support pillar structure.

Figure 19:
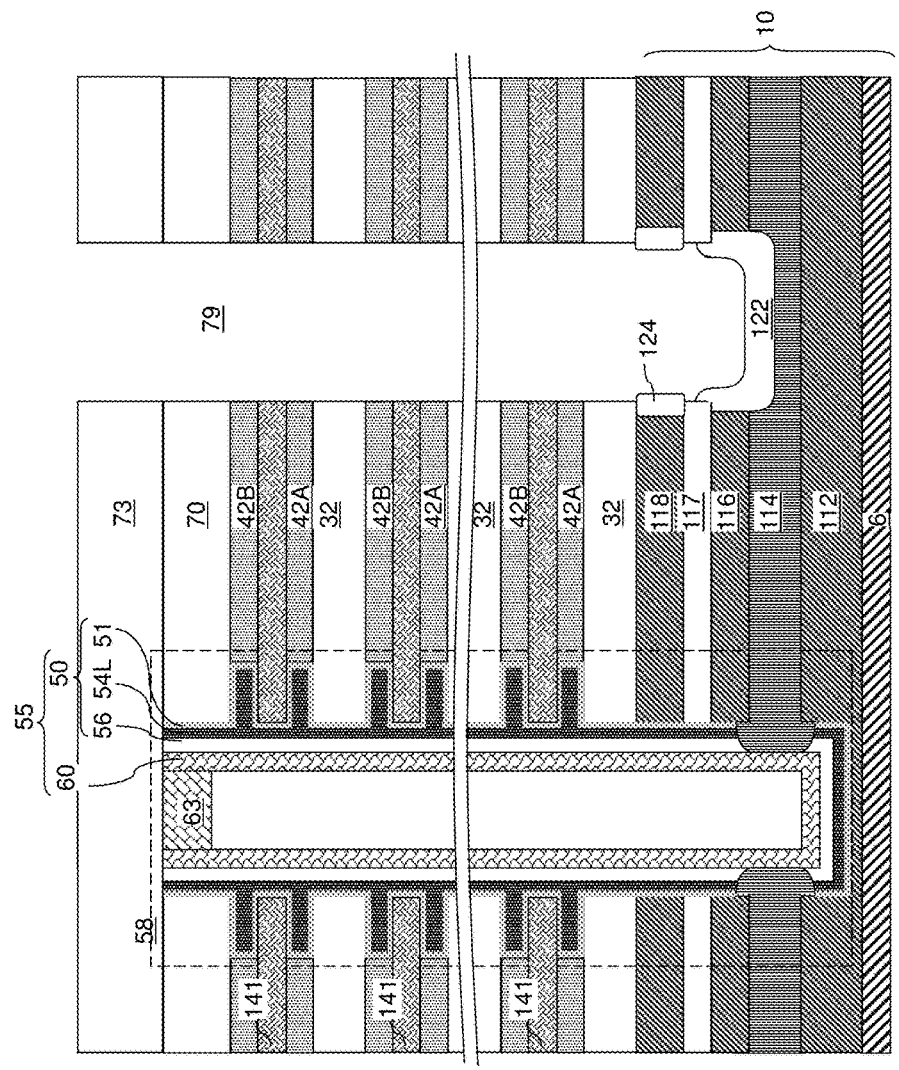
FIG. 19 is a vertical cross-sectional view of a region of the second exemplary structure after replacement of the in-process source level layers with source level layers according to the second embodiment of the present disclosure.

Referring to FIG. 19, the processing steps of FIGS. 7A, 7B, and 8A-8E are performed to form backside trenches 79 and to replace the in-process source-level material layers 10' with source-level material layers 10.

Figure 20:
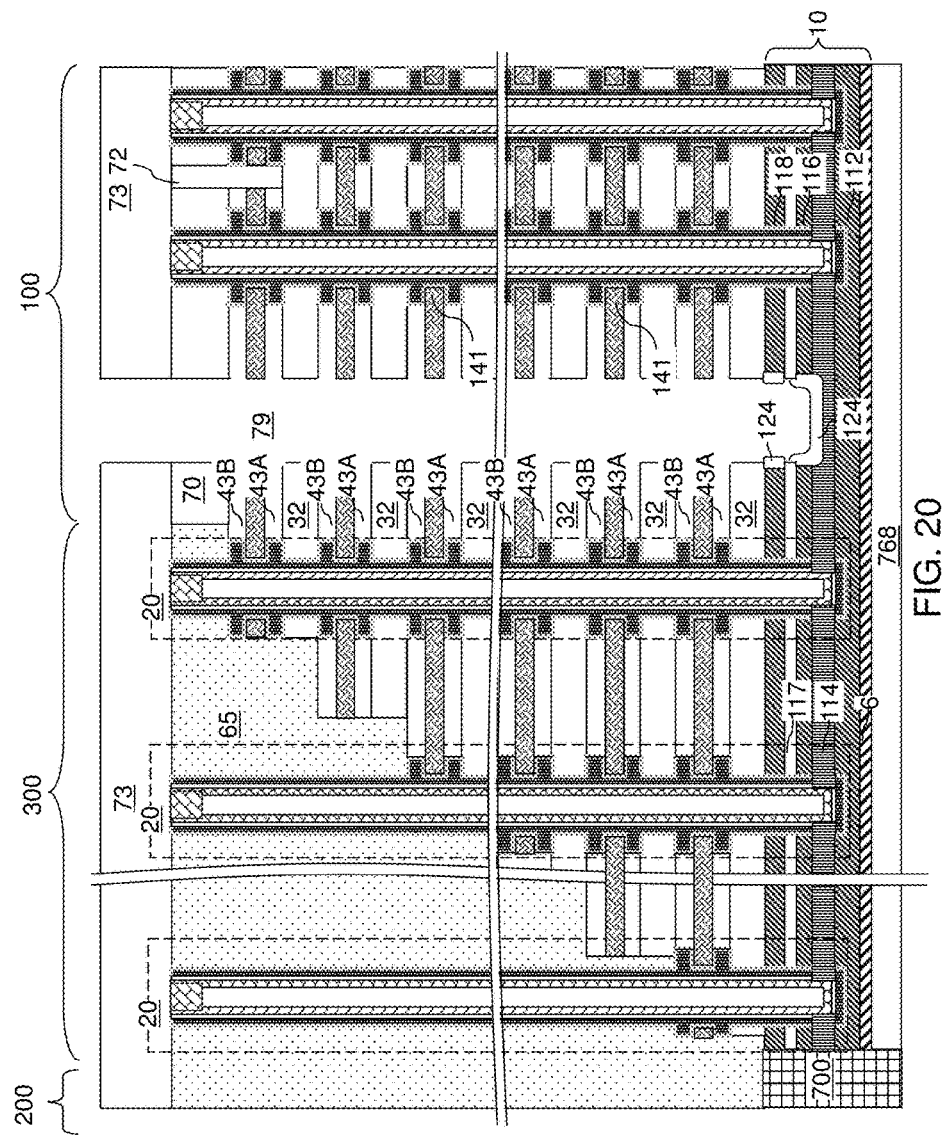
FIG. 20 is a schematic vertical cross-sectional view of the second exemplary structure after formation of in-process backside recesses according to the second embodiment of the present disclosure.

Referring to FIG. 20, the processing steps of FIG. 10 can be performed to remove the upper and lower sacrificial material layers (42B, 42A) selective to the materials of the insulating layers 32, the spacer material layers 142, and the outermost material layers of the memory opening fill structures 58 and the support pillar structures 20. The silicon oxide liner 51 can be employed as an etch stop layer during removal of the upper and lower sacrificial material layers (42B, 42A) and formation of upper and lower backside recesses (43B, 43A).

Figure 21:
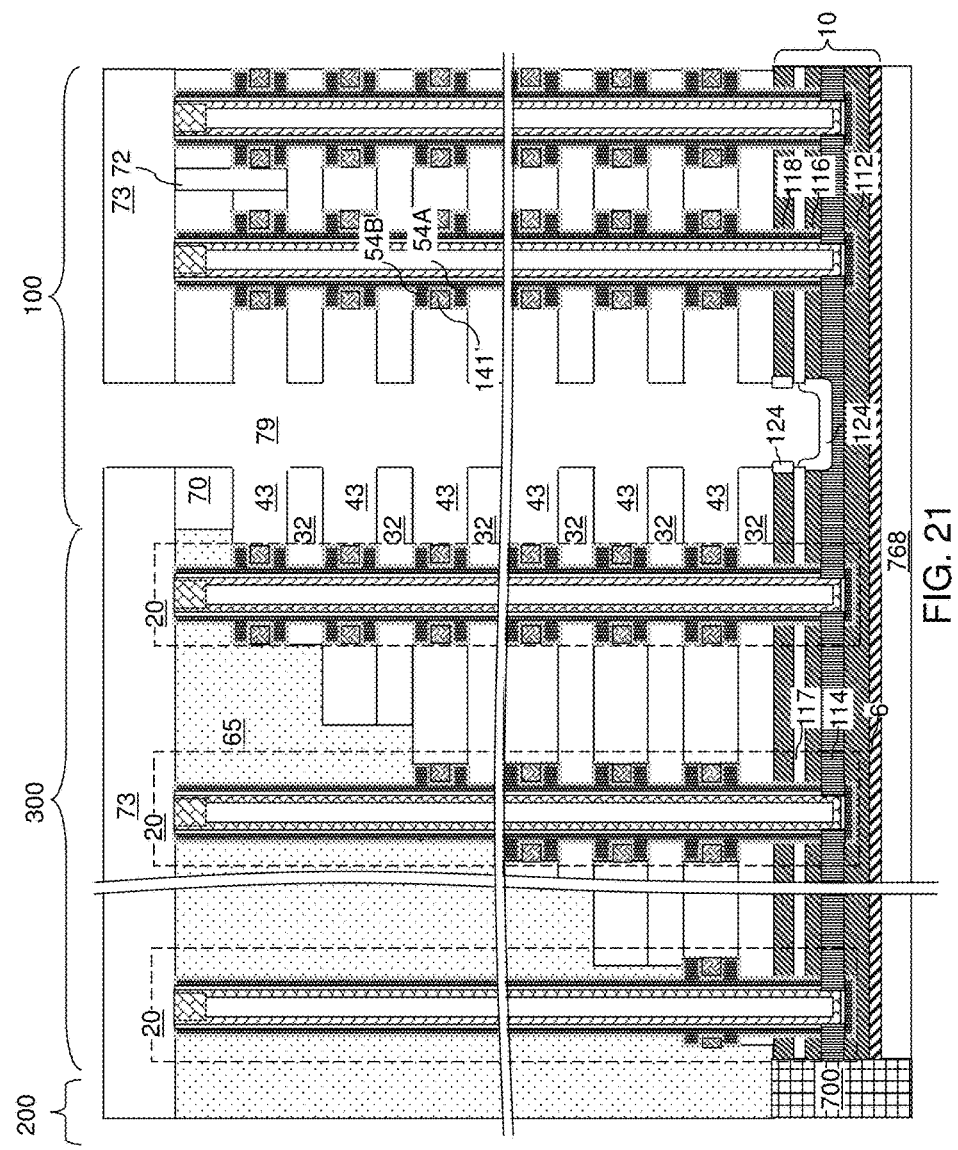
FIG. 21 is a schematic vertical cross-sectional view of the second exemplary structure after formation of backside recesses according to the second embodiment of the present disclosure.

Referring to FIG. 21, the processing steps of FIG. 11 can be performed to isotropically etch the material of the spacer material layers 141. For example, if the spacer material layers 141 include polysilicon, then a wet etch process employing ammonium hydroxide, TMY or TMAH can be employed to remove portions of the spacer material layers 141 located between a vertically neighboring pair of an upper backside recess 43B and a lower backside recess 43A. If the spacer material layers 141 include a metal, a wet etch process employing an etchant for the metal can be employed to remove portions of the spacer material layers 141 located between a vertically neighboring pair of an upper backside recess 43B and a lower backside recess 43A. Each vertical pair of an upper backside recess 43B and a lower backside recess 43A can be joined to form a backside recess 43 that vertically extends between a vertically neighboring pair of insulating layers 32 or between a topmost insulating layer 32 and an insulating cap layer 70. Each remaining portion of the spacer material layers 141 constitutes an annular spacer 141' that laterally surrounds a respective memory stack structure 55. Each annular spacer 141' is located between a respective pair of an upper annular silicon nitride portion 54B and a lower annular silicon nitride portion 54A.

The duration of the isotropic etch process can be selected that the outer sidewall of each annular spacer 141' is located between physically exposed portions of the silicon oxide liner 51. As such, the outer sidewall of each annular spacer 141' can be self-aligned to a respective memory opening fill structure 58 or a support pillar structure 20.

In one embodiment, the memory array region 100 comprises an array of monolithic three-dimensional NAND strings having a plurality of device levels disposed above the substrate 8. In this case, each backside recess 43 can define a space for receiving a respective word line of the array of monolithic three-dimensional NAND strings. Each of the plurality of backside recesses 43 can extend substantially parallel to the top surface of the substrate 8. A backside recess 43 can be vertically bounded by a top surface of an underlying insulating layer 32 and a bottom surface of an overlying insulating layer 32. In one embodiment, each backside recess 43 can have a uniform height throughout.

Figure 22:
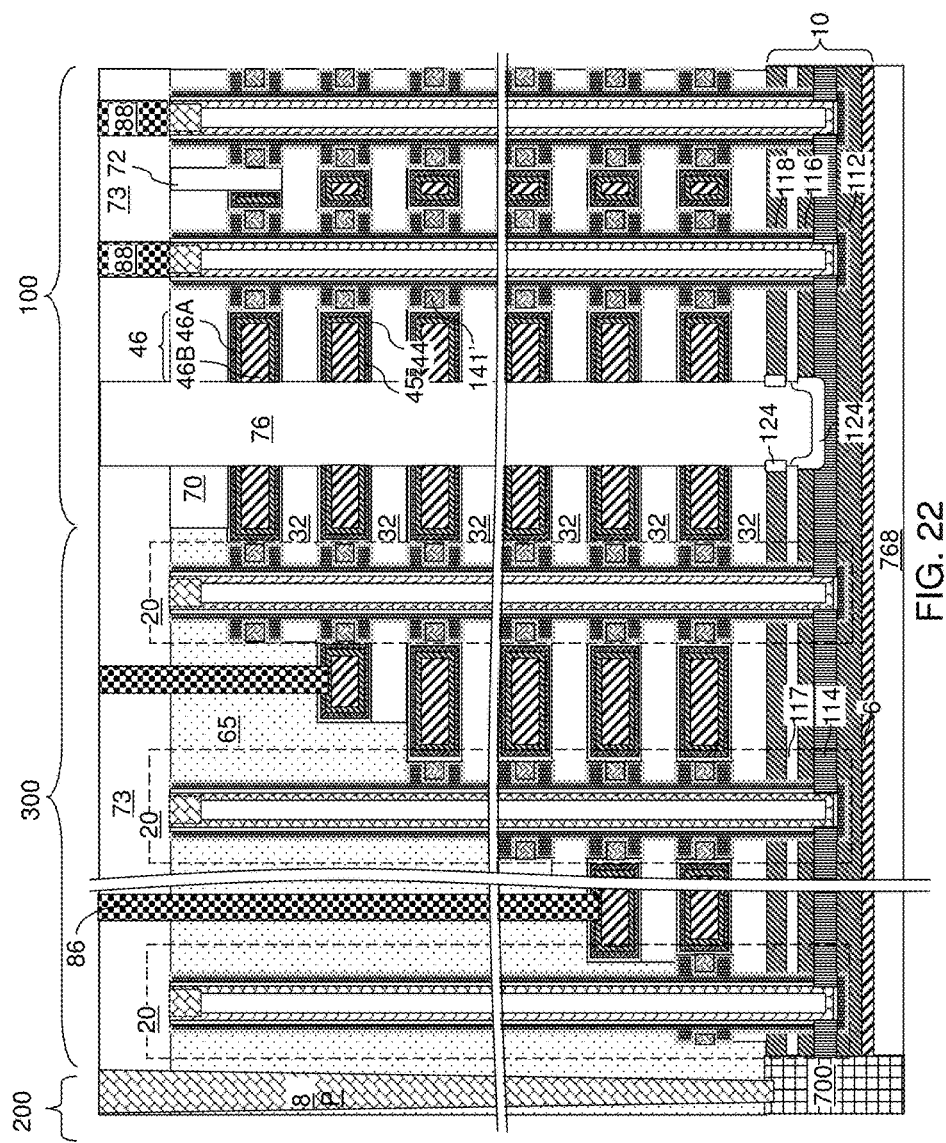
FIG. 22 is a schematic vertical cross-sectional view of the second exemplary structure after formation of additional contact via structures according to the second embodiment of the present disclosure.

Referring to FIG. 22, the processing steps of FIGS. 12B and 13, 14, 15A and 15B can be performed to form backside blocking dielectric layers (44, 45), electrically conductive layers 46, dielectric wall structures 76, and various contact via structures (86, 88, 8P).

Figure 23:
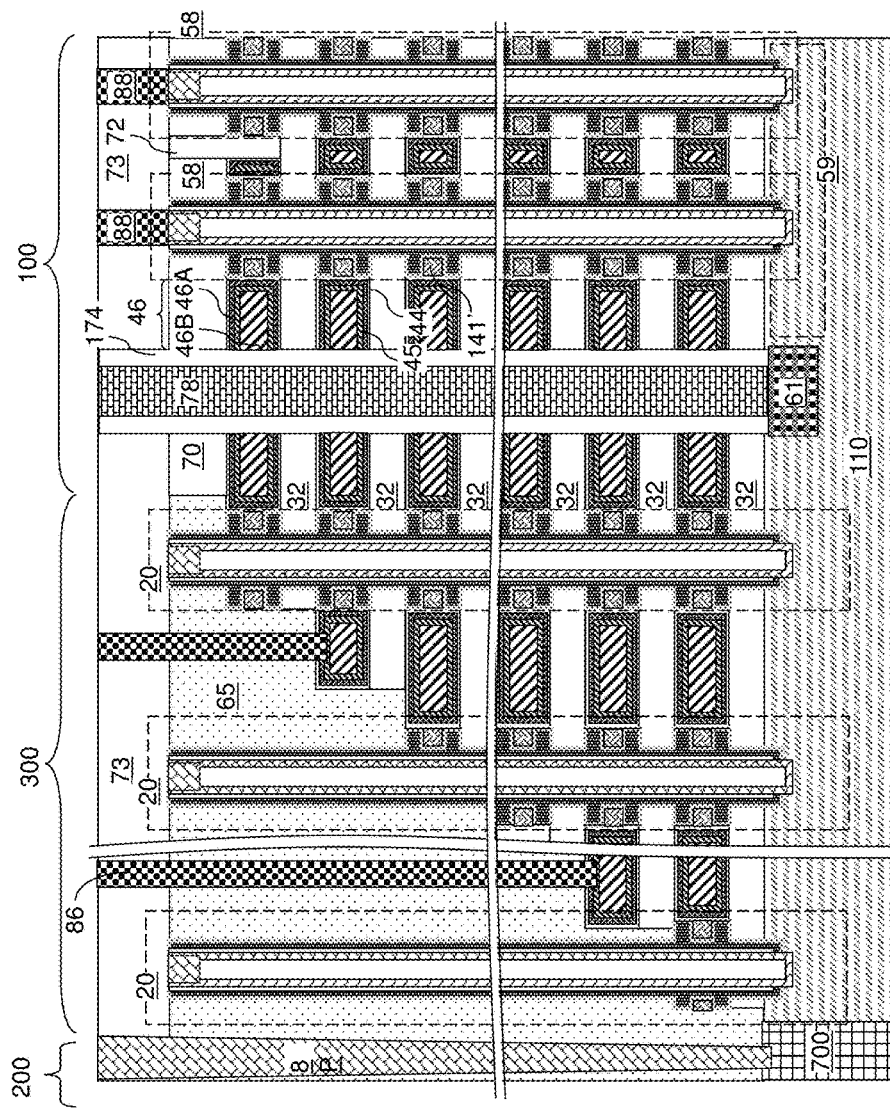
FIG. 23 is a vertical cross-sectional view of an alternative embodiment of the second exemplary structure in which a semiconductor material layer is employed in lieu of source level layers and in which a source contact via structure is formed in lieu of each dielectric wall structure.

Referring to FIG. 23, an alternate embodiment of the second exemplary structure can be derived from the second exemplary structure by employing a semiconductor material layer 110 in lieu of source level layers 10'. In this case, the modifications employed to form the alternative embodiment of the first exemplary structure illustrated in FIG. 16 can be employed to provide the alternative embodiment of the second exemplary structure.

The second exemplary structure and the alternate embodiment of the second exemplary structure comprise a three-dimensional memory device. The memory device comprises an alternating stack of insulating layers 32 and electrically conductive layers 46 located over a substrate (8 or 110); and a memory stack structure 55 extending through the alternating stack (32, 46), wherein the memory stack structure 55 comprises a tunneling dielectric layer 56, a vertical semiconductor channel 60 contacting an inner sidewall of the tunneling dielectric layer 56, and a vertical stack of charge storage structures (54B, 54A, 41') located in a recess adjacent to a respective the electrically conductive layer 46. Each of the charge storage structures comprises an upper silicon nitride portion 54B located adjacent to an upper portion of the respective electrically conductive layer 46, a lower silicon nitride portion 54A located adjacent to a lower portion of the respective electrically conductive layer 46, the lower silicon nitride portion underlying the upper silicon nitride portion; and a spacer 141' located between the upper silicon nitride portion and the lower silicon nitride portion.

The upper annular silicon nitride portion 54B and the lower annular silicon nitride portion 54A are regions of a continuous silicon nitride layer 54L that extends through each of the electrically conductive layers 46 within the alternating stack (32, 46).

In this embodiment, the annular spacers 141' comprise floating gates comprising a semiconductor material or a metallic material (such as an elemental metal). Each annular spacer 141' can include an annular top surface, an annular bottom surface, and a cylindrical inner sidewall of each annular spacer 141' contacts a respective dielectric liner such as a silicon oxide liner 51.

A backside blocking dielectric layer (44, 45) can be formed on an outer sidewall of each annular spacer 141' and on each dielectric liner such as the silicon oxide liner 51. An outer sidewall of the annular spacer 141', an outer sidewall of an upper portion of the dielectric liner (such as the silicon oxide liner 51) that overlie the annular spacer 141', and an outer sidewall of a lower portion of the dielectric liner (such as the silicon oxide liner 51) that underlie the annular spacer 141' contact a backside blocking dielectric layer (44, 45) that contacts a respective one of the electrically conductive layers 46.

In one embodiment, an outer sidewall of the annular spacer 141' contacts a vertical portion of a backside blocking dielectric layer (44, 45) that contacts a respective one of the electrically conductive layers 46. In one embodiment, the respective one of the electrically conductive layers 46 is vertically spaced from an overlying one of the insulating layers 32 and from an underlying one of the insulating layers 32 by horizontal portions of the backside blocking dielectric layer (44, 45).

Figure 24A:
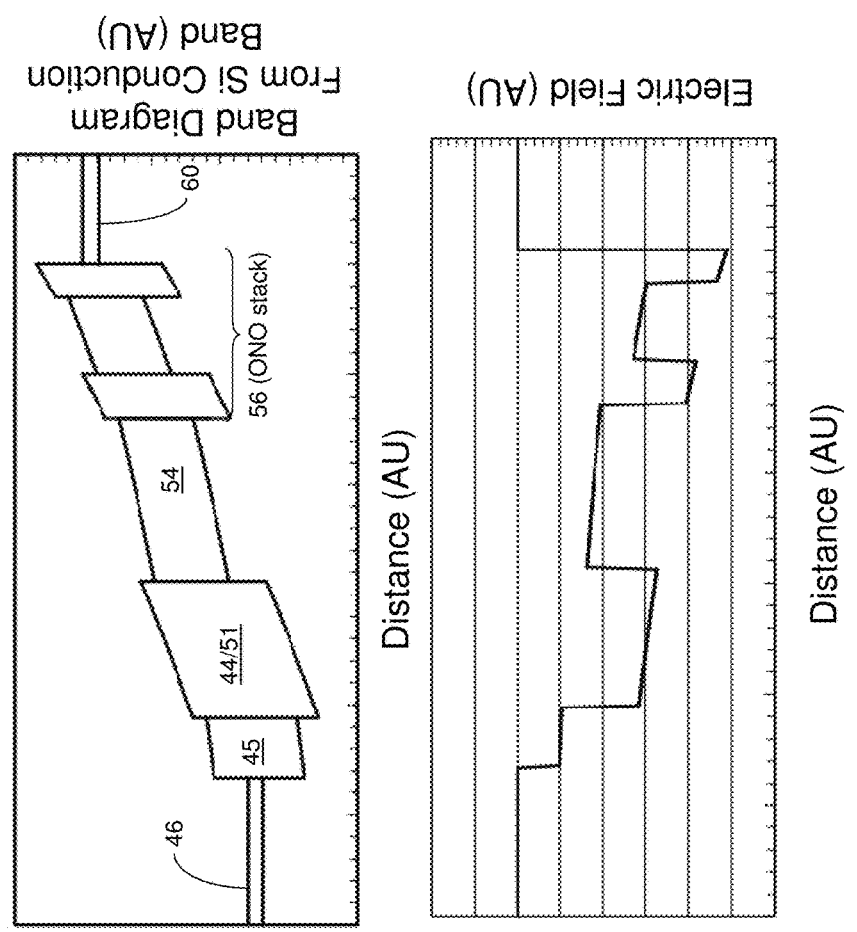
FIG. 24A illustrates a band diagram and electrical field strength during application of a programming bias for a comparative exemplary memory cell that does not employ a dielectric metal oxide liner between a silicon oxide material and a silicon nitride charge trapping material portion.
Figure 24B:
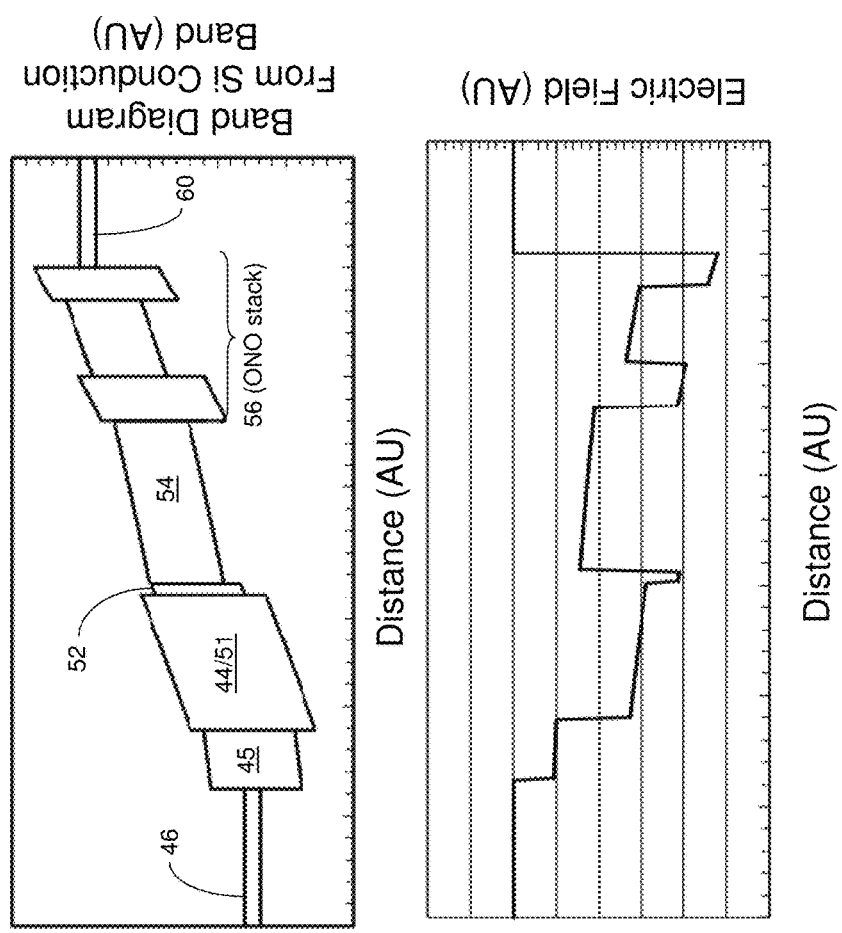
FIG. 24B illustrates a band diagram and electrical field strength during application of a programming bias for a memory cell according to the first embodiment of the present disclosure.

The various exemplary structures of the present disclosure provide enhanced programming characteristics by alteration of local electrical field strength during programming. FIG. 24A illustrates a band diagram and electrical field strength during application of a programming bias for a comparative exemplary memory cell that does not employ a dielectric metal oxide liner between a silicon oxide material and a silicon nitride charge trapping material portion. FIG. 24B illustrates a band diagram and electrical field strength during application of a programming bias for a memory cell in which a dielectric metal oxide liner 52 (i.e., an aluminum oxide liner) is employed according to the first embodiment of the present disclosure. Through use of the dielectric metal oxide liner 52 between the silicon oxide blocking dielectric layer 44 (and the optional silicon oxide liner 51) and the annular silicon nitride portions 54 induces a dipole effect. The dipole effect decelerates electrons from the tunneling dielectric 56 side of the annular silicon nitride portions 54 and increases the likelihood of capture of the electrons due to the lower electrical field. Further, the band offset between the dielectric metal oxide liner 52 and the silicon oxide blocking dielectric layer 44 (and the optional silicon oxide liner 51) reduces the electron tunneling to the electrically conductive layers 46. Thus, the first exemplary structure (and alternative embodiments thereof) enhances electron capture during programming.

Figure 25B:
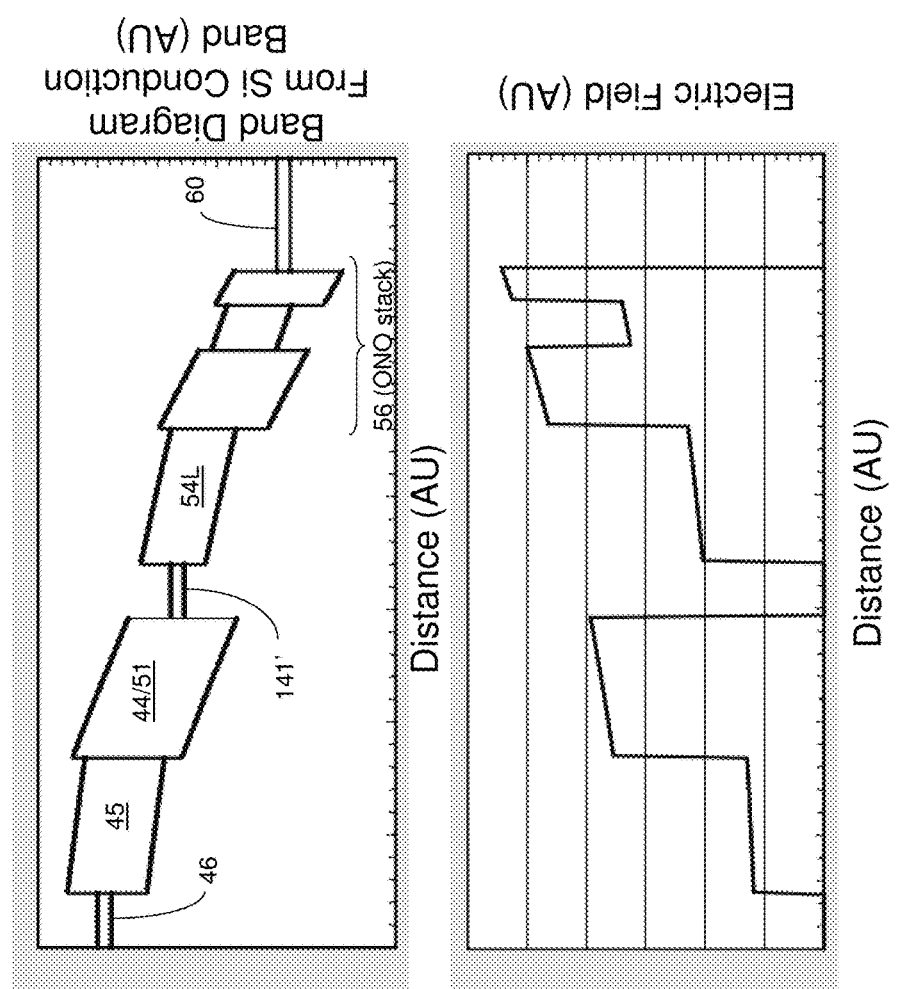
FIG. 25B illustrates a band diagram and electrical field strength during application of an erase bias for a memory cell according to the second embodiment of the present disclosure.
Figure 25C:
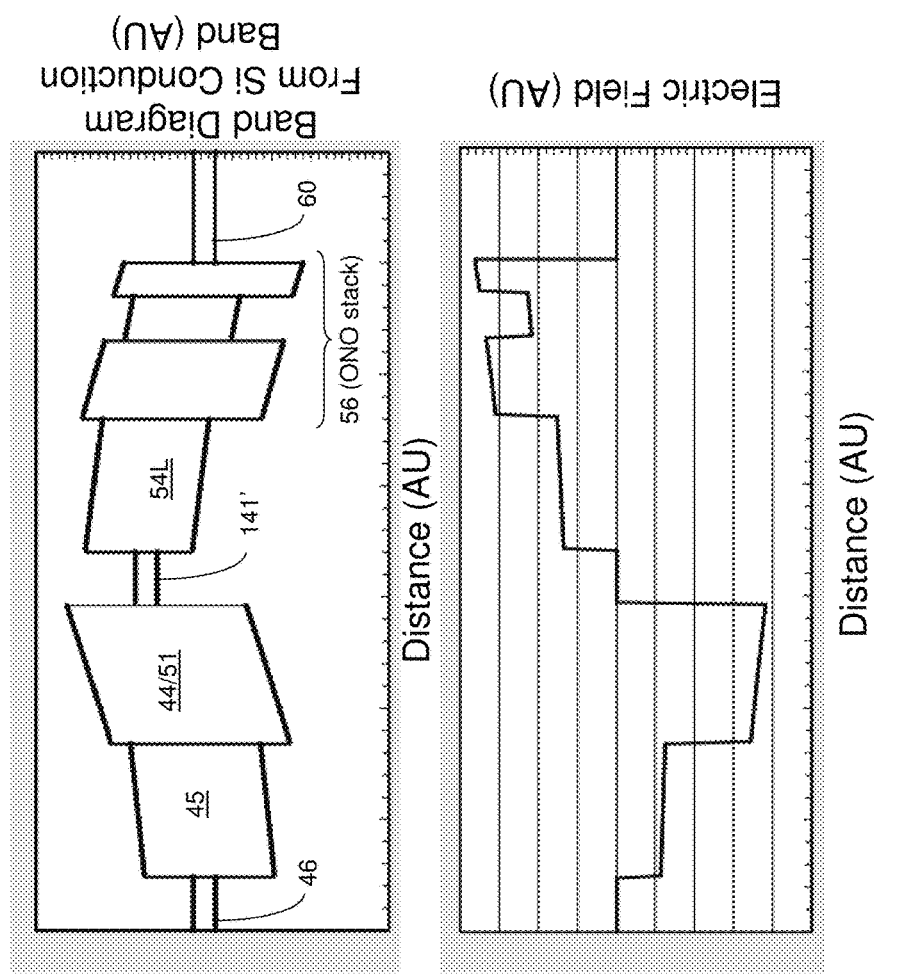
FIG. 25C illustrates a band diagram and electrical field strength during retention of data for a memory cell according to the second embodiment of the present disclosure.

FIGS. 25A, 25B, and 25C illustrate band diagrams and electrical field strengths during a programming mode, during an erase mode, and during a retention mode, respectively. In the second exemplary structure, the floating gates which comprise the annular spacers 141' are employed. In one embodiment, the floating gates may include a doped semiconductor (e.g., doped polysilicon) material. The floating gates decelerate electrons from the tunneling dielectric 56 side of the annular silicon nitride portions 54 and increase the likelihood of capture of the electrons due to the lower electrical field. Thus, a dipole layer, such as the dielectric metal oxide layer 52 of the first embodiment may be omitted in the second exemplary structure. An improved charge carrier annihilation rate can be obtained at the floating gates 141' due to the valence band dip. Furthermore, the charge retention is improved due to the larger band offset around the floating gate.

The thickness of the annular silicon nitride portions (54A, 54B) can be greater than the thickness of the vertical portions of the silicon nitride layer 54L by a factor greater than 1 and less than 2, such as a factor in a range from 1.6 to 1.8. As such, the vertical portions of the silicon nitride layer 54L can be thinner than in prior art embodiments that do not employ annular silicon nitride portions. Reduction in the thickness of the vertical portions of the silicon nitride layer 54L can reduce the inter-level charge diffusion and enhance charge retention. Thus, the second exemplary structure can provide enhanced data retention through isolation of silicon nitride material portions by the insulating layers 32 among the electrically conductive layers 46.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where the first embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A three-dimensional memory device comprising:
an alternating stack of insulating layers and electrically conductive layers located over a substrate; and
a memory stack structure extending through the alternating stack, wherein the memory stack structure comprises a tunneling dielectric layer, a vertical semiconductor channel contacting an inner sidewall of the tunneling dielectric layer, and a vertical stack of charge storage structures,
wherein each of the charge storage structures is located in a recess adjacent to a respective the electrically conductive layer; and
wherein each of the charge storage structures comprises:
an upper silicon nitride portion located adjacent to an upper portion of the respective electrically conductive layer;
a lower silicon nitride portion located adjacent to a lower portion of the respective electrically conductive layer, the lower silicon nitride portion underlying the upper silicon nitride portion; and
a spacer located between the upper silicon nitride portion and the lower silicon nitride portion.

2. The three-dimensional memory device of claim 1, wherein:
the electrically conductive layers comprise word lines;
each charge storage structure is located between a backside blocking dielectric and the tunneling dielectric; and
an outer sidewall of the spacer contacts a vertical portion of the backside blocking dielectric layer that contacts the respective electrically conductive layer.

3. The three-dimensional memory device of claim 2, wherein the respective electrically conductive layer is vertically spaced from an overlying one of the insulating layers and from an underlying one of the insulating layers by horizontal portions of the backside blocking dielectric layer.

4. The three-dimensional memory device of claim 1, further comprising dielectric liner continuously extending from an outer sidewall of the upper silicon nitride portion to an outer sidewall of the lower silicon nitride portion and including a vertically extending portion located between an inner sidewall of the spacer and a tunneling dielectric layer.

5. The three-dimensional memory device of claim 1, wherein the spacer comprises a floating gate including a conductive material or a semiconductor material.

6. The three-dimensional memory device of claim 5, wherein the upper silicon nitride portion and the lower silicon nitride portion are regions of a continuous silicon nitride layer that extends through each of the electrically conductive layers within the alternating stack.

7. The three-dimensional memory device of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the electrically conductive layers comprise a plurality of control gate electrodes having a strip shape extending substantially parallel to the top surface of the substrate.

\* \* \* \* \*